(12) United States Patent
Yamada et al.

(10) Patent No.: US 6,208,564 B1
(45) Date of Patent: Mar. 27, 2001

(54) HIGH VOLTAGE COMPARATOR

(75) Inventors: Shigekazu Yamada; Yasushi Kasa, both of Cupertino, CA (US)

(73) Assignee: Fujitsu Limited (JP)

( * ) Notice: Subject to any disclaimer, the term of this patent is extended or adjusted under 35 U.S.C. 154(b) by 0 days.

(21) Appl. No.: 09/429,987

(22) Filed: Oct. 29, 1999

Related U.S. Application Data

(60) Provisional application No. 60/146,424, filed on Jul. 29, 1999.

(51) Int. Cl.[7] ........................................ G11C 7/00
(52) U.S. Cl. .................. 365/189.07; 365/185.2; 365/210; 365/226
(58) Field of Search ................................ 365/226, 189.07, 365/189.09, 185.2, 210; 327/538, 545

(56) References Cited

U.S. PATENT DOCUMENTS

| | | | | |
|---|---|---|---|---|
| 5,841,724 | * | 11/1998 | Ebel et al. | 365/189.07 |
| 5,999,475 | * | 12/1999 | Futatsuya et al. | 365/185.23 |
| 6,067,269 | * | 5/2000 | Han et al. | 365/226 |

* cited by examiner

*Primary Examiner*—Son T. Dinh
(74) *Attorney, Agent, or Firm*—Christie, Parker & Hale, LLP

(57) ABSTRACT

A high voltage comparator circuit quickly identifies the voltage level of the predetermined voltages required for program operations. Through the series of transistors, the precise timing of when the predetermined voltages are at their operating voltage level is identified.

16 Claims, 16 Drawing Sheets

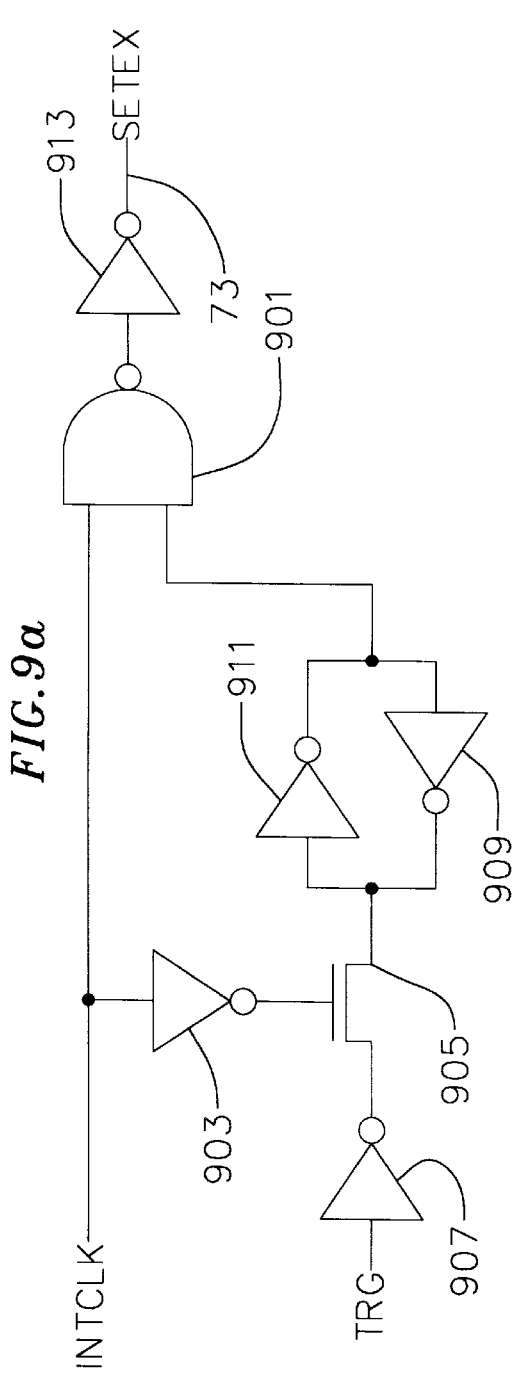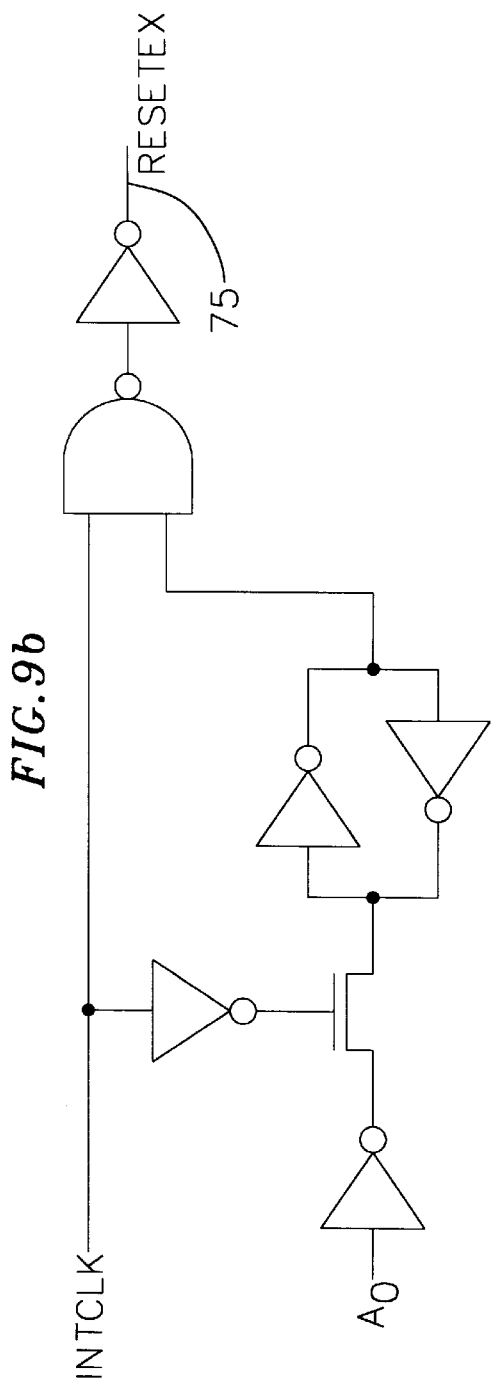

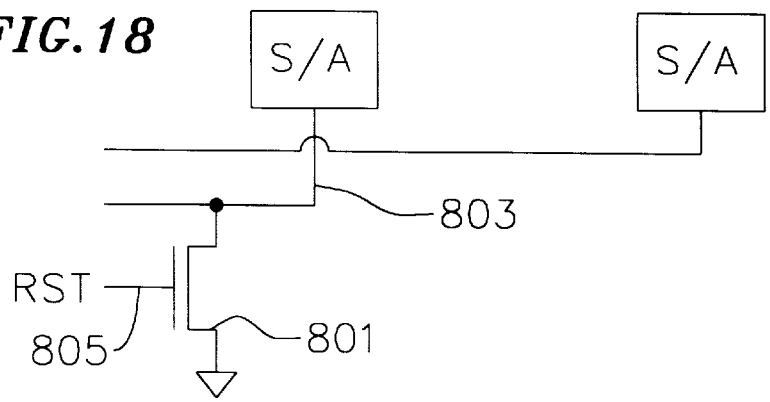
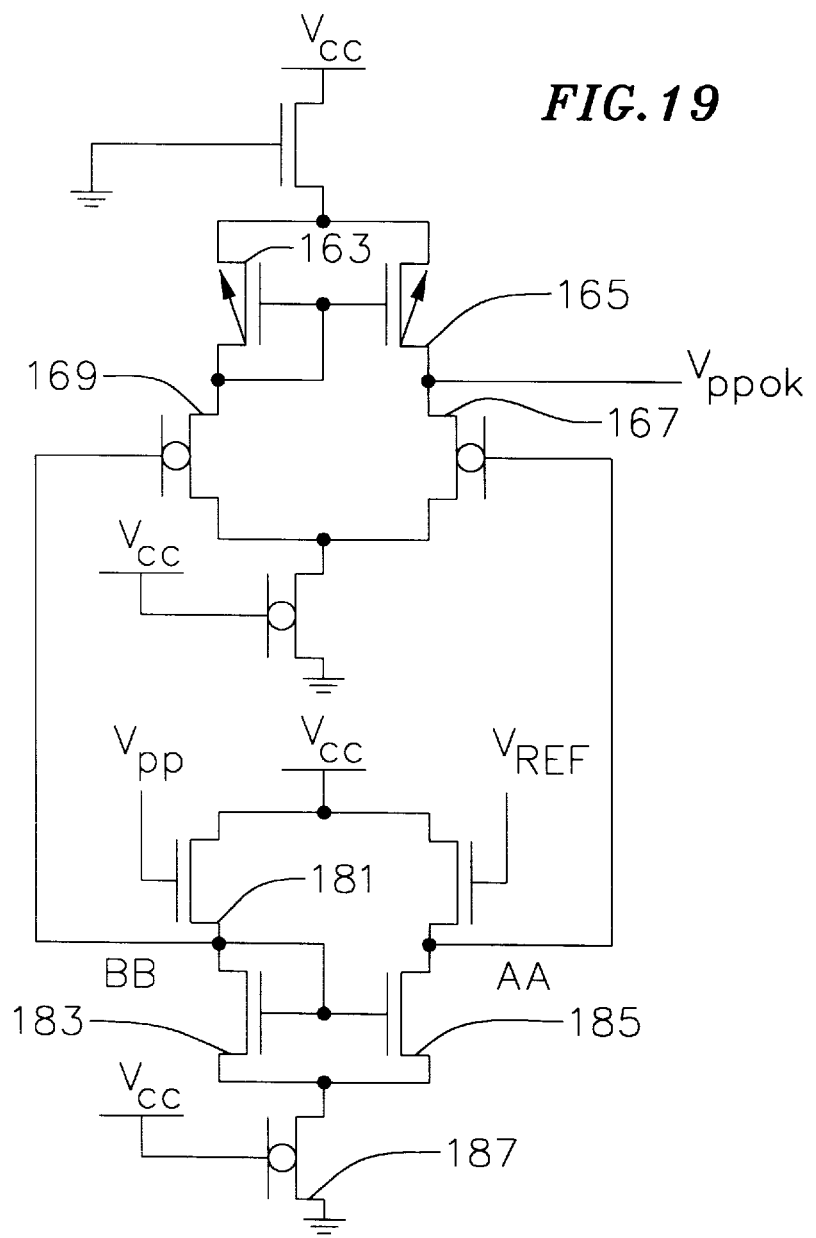

HIGH VOLTAGE COMPARATOR

CROSS-REFERENCE TO RELATED APPLICATION

This application claims the priority of U.S. Provisional Application entitled Clock Control Circuit and Decoder Circuit and High Voltage Comparator, Application No. 60/146,424, filed Jul. 29, 1999 which is hereby incorporated by reference as if set forth in full herein.

BACKGROUND OF THE INVENTION

This invention relates generally to semiconductor devices, and more particularly to a high voltage comparator for semiconductor devices, especially non-volatile semiconductor memory devices such as flash memory devices.

Generally, a flash memory device comprises an address sequencer, row and column decoders, sense amplifiers, write amplifiers, and a memory cell array. An example of a flash memory device is described in U.S. Pat. No. 5,490,107, the disclosure of which is herein incorporated by reference. The memory cell array contains a plurality of memory cells arranged in rows and columns. Each memory cell is capable of holding a single bit of information. A column of memory cells in the memory cell array is commonly coupled to a bit line. The column decoder along with the address sequencer selects a bit line. Similarly, the memory cells arranged in a row of the memory cell array are commonly coupled to a word line. The row decoder and address sequencer selects a word line. Together the row and column decoders and the address sequencer selects an individual memory cell or a group of memory cells.

The memory cells in the memory cell array of a flash memory device are generally grouped into sub-arrays called memory cell blocks. Each memory cell block is coupled to a sense amplifier and a write amplifier. The write amplifier (W/A) applies a set of predetermined voltages to store information in the selected memory cells. This action is referred to as a program or write operation. Similarly, a set of predetermined voltages applied to the selected memory cells allows information to be discriminated and retrieved by the sense amplifier (S/A). This action is referred to as a read operation.

During a write or program operation, a set of predetermined voltages, relatively high program voltage $V_{pp}$, needs to be supplied by the decoder circuits to the memory cells. These predetermined voltages are generated independently and must achieve a specific operating voltage level before the memory cell is capable of being programmed. Furthermore, these predetermined voltages are controlled independently of each other. Therefore, precise timing of when these predetermined voltages would be high enough, i.e. at a specific operating voltage level, to start programming the memory cell is difficult to determine, especially with the predetermined voltages being a higher voltage level than $V_{cc}$, the voltage applied to the flash memory device. By knowing the precise timing of when the predetermined voltages are high enough to start programming the memory cell, the memory cells are capable of being programmed as quickly as possible.

SUMMARY OF THE INVENTION

The present invention provides a high voltage comparator. The high voltage comparator comprises a set of transistors to identify when a first voltage corresponds to a second voltage and the first and second voltages are larger then an operating voltage supplied to the high voltage comparator.

In another embodiment, a flash memory device is provided comprising a plurality of memory cells and a high voltage comparator. The high voltage comparator receives a plurality of high program voltages and generates an output signal when the plurality of high program voltages correspond to each other. The plurality of high program voltages are predetermined voltages for programming the plurality of memory cells.

Many of the attendant features of this invention will be more readily appreciated as the same becomes better understood by reference to the following detailed description and considered in connection with the accompanying drawings in which like reference symbols designate like parts throughout.

DESCRIPTION OF THE DRAWINGS

FIG. 9(a) is a schematic of one embodiment of a set extended sense buffer circuit;

FIG. 9(b) is a schematic of one embodiment of a reset extended sense buffer circuit;

FIG. 18 is a block diagram for one embodiment of a data sensing scheme; and

FIG. 19 is a schematic of one embodiment of a high voltage comparator.

DETAILED DESCRIPTION OF THE INVENTION

I. Overview

Figure 1:
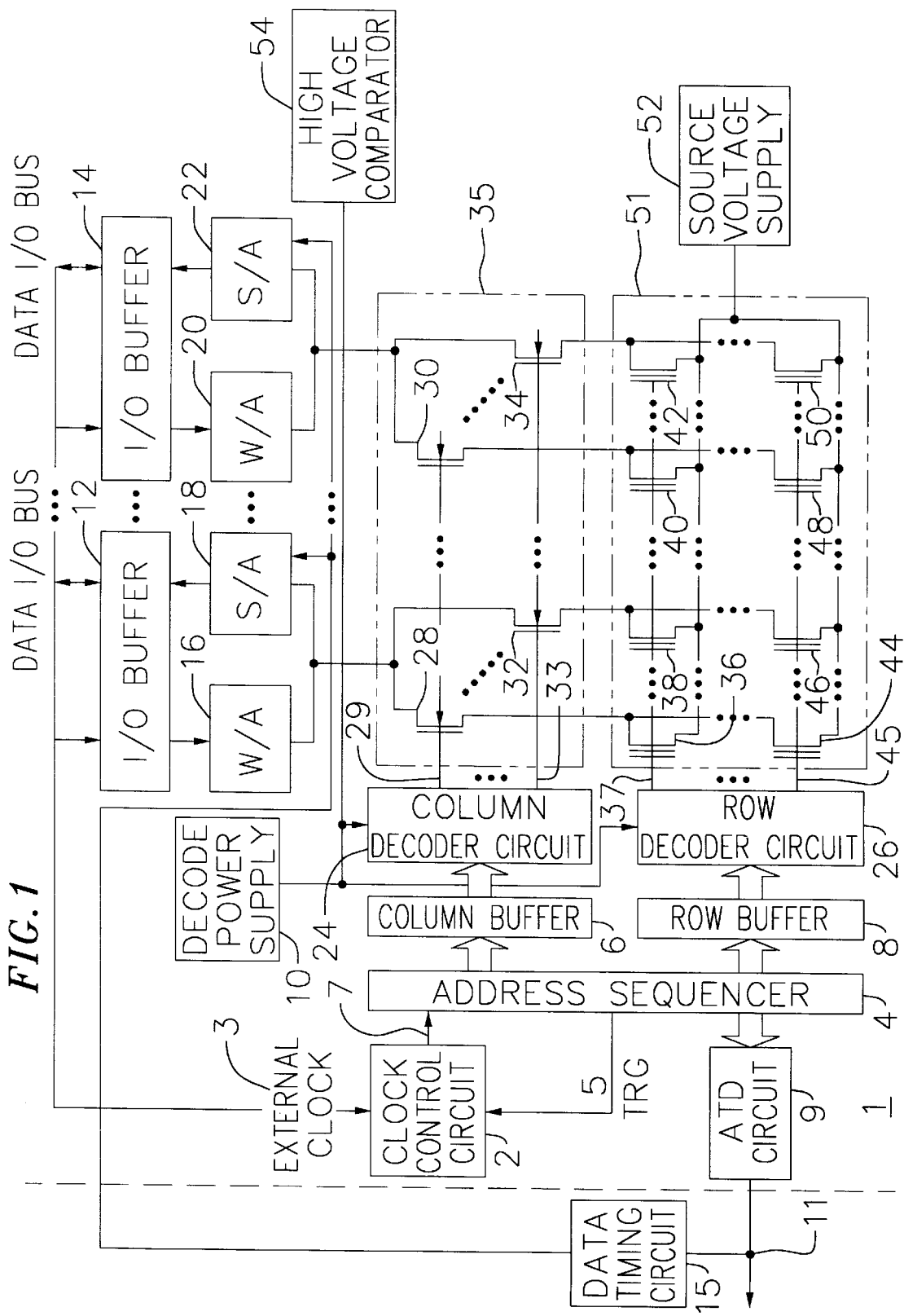
FIG. 1 is an top level block diagram of a flash memory device of the present invention.

In FIG. 1, one embodiment of a synchronous flash memory is shown. The synchronous flash memory has a clock control circuit 2. The clock control circuit 2 receives an external clock signal 3, and combines the external clock signal with a trigger signal 5 to generate an internal clock signal 7. An address sequencer 4 receives the internal clock signal 7 and sequences through addresses and generates address signals synchronously to the internal clock signal 7. The address signals are provided to column and row buffers 6 and 8. The address signals are selectively modified and supplied to column and row decoder circuits 24 and 26. The column and row decoder circuits generate column and row decoded signals to select specific memory cells in the memory cell array 51 for read and program operations.

Each memory cell has a construction similar to a MOS transistor, and as such, a memory cell has a source region and a drain region on a substrate. Between the substrate, the memory cell has a floating gate and a control gate. Information is stored in the memory cell, i.e. in the floating gate, by applying a set of predetermined voltages to the memory cell. Likewise, a set of predetermined voltages applied to the memory cell is used to read information contained in the memory cell.

The memory cell array 51 contains a plurality of memory cells 36, 38, 40, 42, 44, 46, 48 and 50. For clarity, only a subset of the memory cells in the memory cell array 51 is shown. The memory cells 36, 38, 44 and 46 are grouped into a first memory cell block and the memory cells 40, 42, 48 and 50 are grouped into a second memory cell block. Each memory cell block is coupled to a corresponding write amplifier and sense amplifier pair through corresponding control transistors. Specifically, the drains of the control transistors are coupled to a write amplifier and a sense amplifier. For instance, drain of the first column control transistors 28 of the first memory cell block is coupled to write amplifier 16 and sense amplifier 18.

Similarly, drains of the memory cells are coupled to control transistors. For instance, drains of the memory cells 36 and 44 are coupled to a source of a first column control transistor 28. The gates of the control transistors are coupled to the column decoder circuit 24 through decoded signal lines. For instance, gates of first and third column control transistors 28 and 30 are coupled to a first column decoded signal line 29 from the column decoder circuit 24.

Each write amplifier and sense amplifier pair is also coupled to a corresponding input/output buffer. In FIG. 1, the write amplifier 16 and the sense amplifier 18 are coupled to input/output buffer 12 and write amplifier 20 and sense amplifier 22 are coupled to input/output buffer 14.

The input/output buffers 12 and 14 are further coupled to the external clock signal 3 and a data input/output bus 1. Prior to a program operation, program data coming over a data input/output bus are stored in corresponding input/output buffers, synchronously to the external clock signal 3. The program operation then executes synchronously to the internal clock signal 7 generated by the clock control circuit 2. During a read operation, detected or sensed data are stored in corresponding input/output buffers, synchronously to the internal clock signal 7, and then transferred out over the data input/output bus 1, synchronously to the external clock signal 3. Input and output transfers to and from the input/output buffers are capable of being executed simultaneously. These synchronous transfers allows the speed for both a read and program operation to be maximized. However, each read and program operation depends on the internal clock signal 7 generated by the clock control circuit 2.

II. Clock Control Circuit

As previously described in reference to FIG. 1, predetermined voltage levels must be applied to the appropriate memory cells to perform a read operation. These read voltages are applied over the word and bit lines. These word and bit lines inherently have built in delays due to resistance and capacitance on a given line. During a read operation, when there is a transition from the last set of memory cells on a word line to the next set of memory cells on a next word line, i.e. a boundary crossing or word line switch, these delays are increased. Since the operating read voltage levels must be removed from one word line and applied to another word line, a read operation for a word line switch often takes twice as long as a read operation from one memory cell to another memory cell in the same word line. In other words, data sensing may take longer than one clock period of the external clock signal 3.

Figure 2:
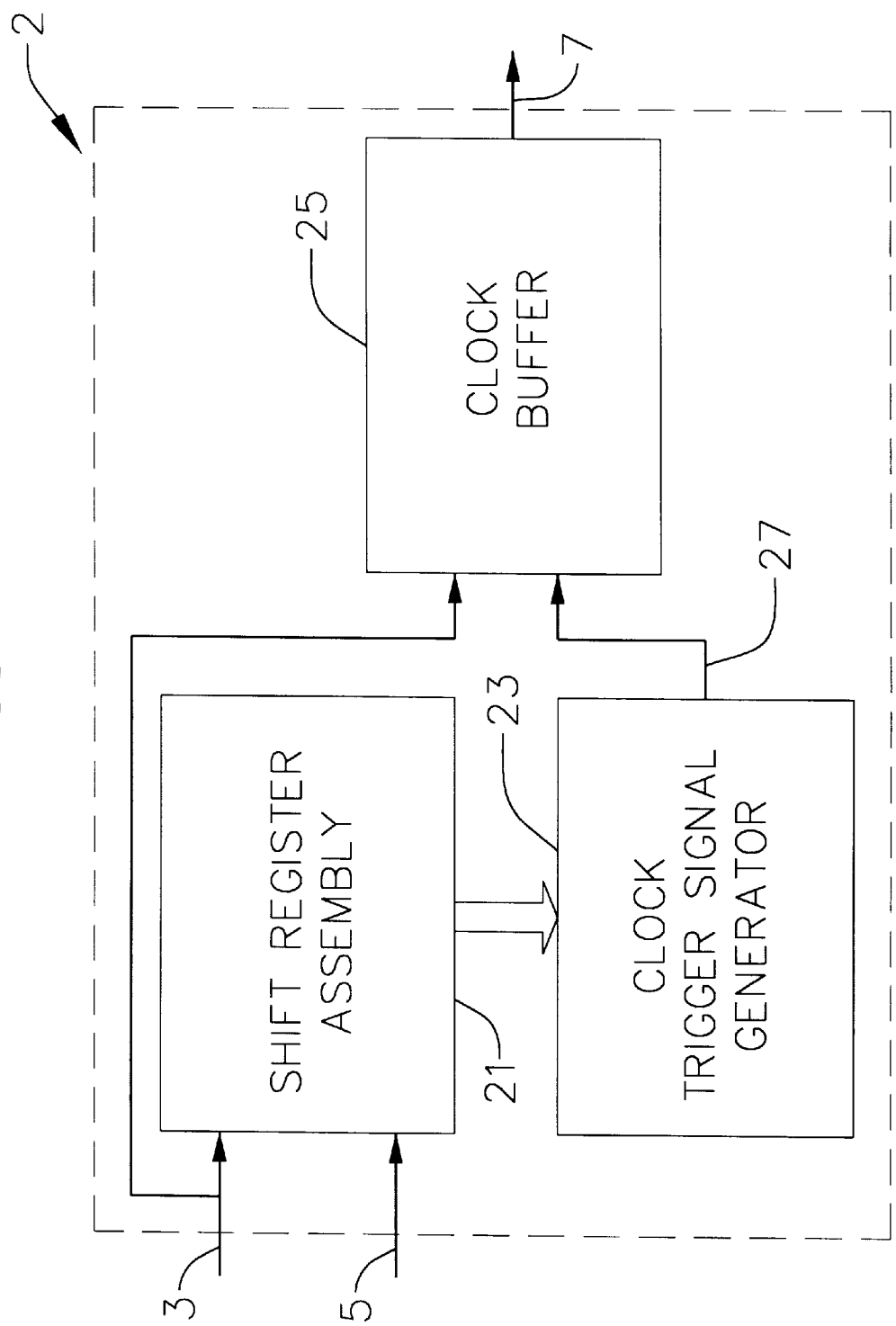
FIG. 2 is a top level block diagram of one embodiment of a clock control circuit.

To provide additional time for data sensing, an internal clock signal 7 is generated by the clock control circuit 2 of FIG. 2. The internal clock signal 7 is synchronized to the external clock signal, but contains one or more clock cycles blocked out. By supplying the internal clock signal 7 to the address sequencer, data being clocked out to the data I/O bus is delayed as necessary to allow for more time for data sensing.

The clock control circuit 2 contains a shift register assembly 100, a clock trigger signal generator 23 and a clock buffer 25. With the inputs of the external clock signal 3 and the trigger signal 5, the clock control circuit 2 produces the internal clock signal 7. The shift register assembly 100 uses the external clock signal 3 to supply delayed trigger signals to the clock trigger signal generator 23. With the inputs of the external clock signal 3 and a clock trigger signal 27 generated from the clock trigger signal generator 23, the clock buffer produces the internal clock signal 7.

Figure 3:
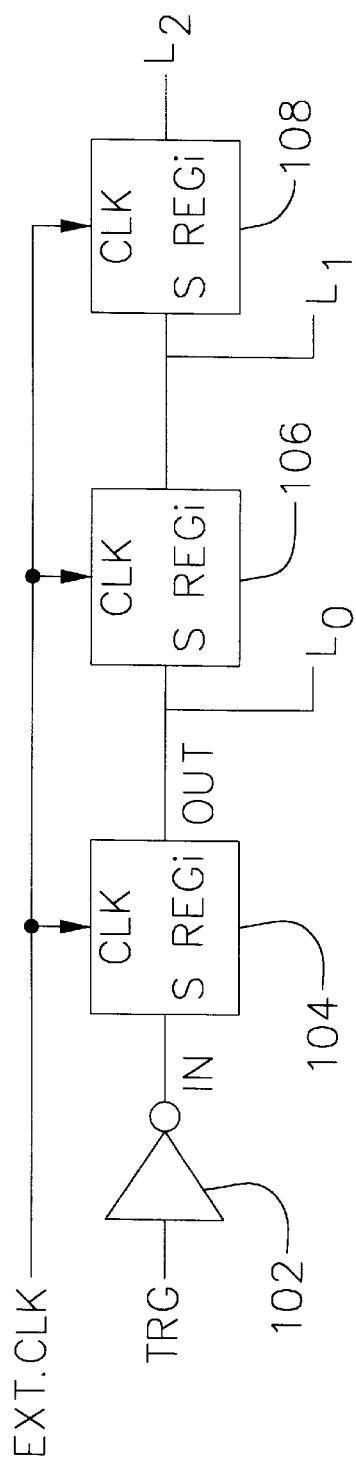
FIG. 3 is a block diagram of one embodiment of the shift register assembly of the clock control circuit of FIG. 2.

FIG. 3 illustrates one embodiment of the shift register assembly 100. The trigger signal 5 is generated from the address sequencer shown in FIG. 1. The address sequencer 4 generates the trigger signal 5 upon each increment of an address. The trigger signal 5 is coupled to an input of an inverter 102. An output of the inverter 102 is coupled to an input of a first shift register 104. An output, the first time delayed trigger signal $L_0$, of the first shift register 104 is coupled to an input of a second shift register 106. An output, the second time delayed trigger signal $L_1$, of the second shift register 106 is coupled to an input of a third shift register 108. The third shift register 108 generates a third time delayed trigger signal $L_2$ as an output. Each of the shift registers 104, 106 and 108 are coupled to the external clock 3. Although FIG. 3 shows only three shift registers in the shift register assembly 100, the number of shift registers used is flexible, and depends on the number of external clock cycles to be blocked out from the internal clock signal 7.

Figure 4:
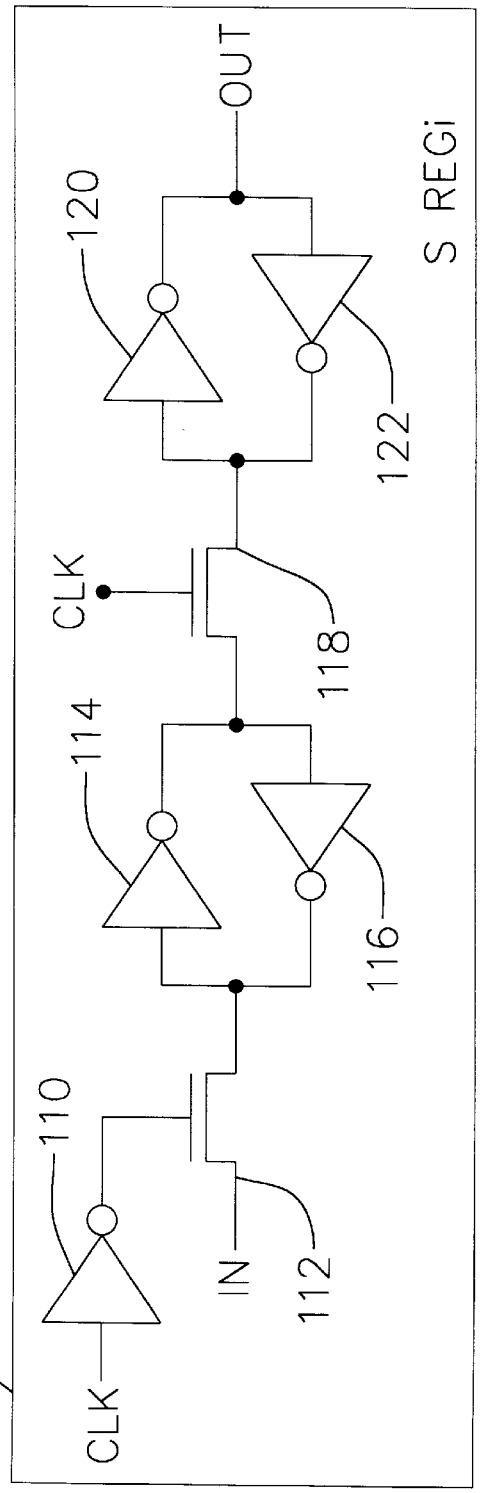
FIG. 4 is a schematic of one of the shift registers in the shift register assembly of FIG. 3.

In FIG. 4, one embodiment of the shift registers 104, 106, 108 in the shift register assembly 100 of FIG. 3 is shown. The external clock signal 3 is coupled to an input of an inverter 110. An output of the inverter 110 is coupled to a gate of a transistor 112. A drain of the transistor 112 is coupled to the input of the shift register 104. A source of the transistor 112 is coupled to an input of an inverter 114 and an output of an inverter 116. The inverters 114 and 116 comprise a first latch. This first latch stores the input of the shift register synchronously to a falling edge of the external clock signal 3.

An output of the inverter 114 and an input of the inverter 116 are coupled to a drain of a transistor 118. A gate of the transistor 118 is coupled to the external clock signal 3. A source of the transistor 118 is coupled to an input of an inverter 120 and an output of an inverter 122. The inverters 120 and 122 comprise a second latch. This second latch stores the content of the first latch synchronously to a rising edge of the external clock signal 3. An output of the inverter 120 and an input of the inverter 122 are coupled together and provide the output of the shift register, a time delayed trigger signal.

The clock trigger signal generating circuit 130 receives the time delayed trigger signals $L_0$, $L_1$, and $L_2$ produced from the shift register assembly 100. The clock trigger signal generating circuit 130 in FIG. 5 contains in parallel a first, second and third two-input NOR gates 132, 134 and 136. The first time delayed trigger signal $L_0$ is coupled to a first input of the first two-input NOR gate 132. The second time delayed trigger signal $L_1$ is coupled to a first input of the second two-input NOR gate 134 and the third time delayed trigger signal $L_2$ is coupled to a first input of the third two-input NOR gate 136.

Second inputs of the two-input NOR gates 132, 134 and 136 are coupled to the clock block signals B1, B2 and B3, respectively. Although clock block signals B1, B2 and B3 are typically set prior to fabrication of the synchronous flash memory device, the clock block signals are capable of being set during the operation of the synchronous flash memory device. The clock block signals B1, B2 and B3 determine the number of external clock cycles to be blocked out of the internal clock signal 7.

For example, if the first clock block signal B1 is set low and the second and third clock block signals B2 and B3 are set high, one external clock cycle is blocked out from the internal clock signal 7. If the first and second clock block signals B1 and B2 are set low with the third clock block signal B3 set high, two external clock cycles are blocked out from the internal clock signal 7.

Figure 5:
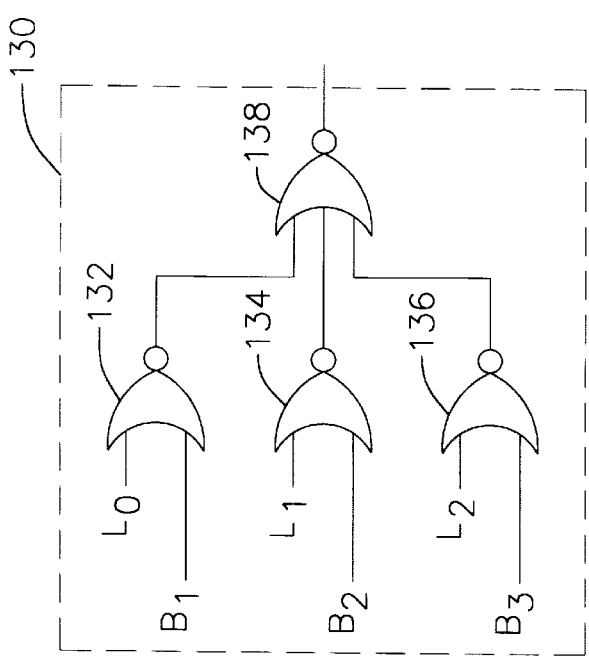
FIG. 5 is a schematic of one embodiment of the trigger signal generating circuit of FIG. 2.

Although FIG. 5 shows three two-input NOR-gates in the clock trigger signal generating circuit 130, the number of two-input NOR-gates used depends only on the number of clock cycles to be blocked out from the internal clock signal 7.

The clock trigger signal generating circuit 130 also comprises a three-input NOR gate 138. Outputs of the three two-input NOR gates are coupled to inputs of the three-input NOR gate 138. An output of the three-input NOR gate 138 is the output of the clock trigger signal generating circuit and is coupled to an input of a clock buffer 140 in FIG. 2. The output of each of the two-input NOR gates 132, 134 and 136 goes high when both the corresponding clock block signal and the corresponding time delayed trigger signal are low. When one or more of the outputs of the two-input NOR gates goes high, the output of the three-input NOR gate 138 goes low. This output of the three-input NOR gate 138 is the clock trigger signal used to block out one or more of the external clock signals when combined with the external clock signal 3 in the clock buffer 140.

Figure 6:
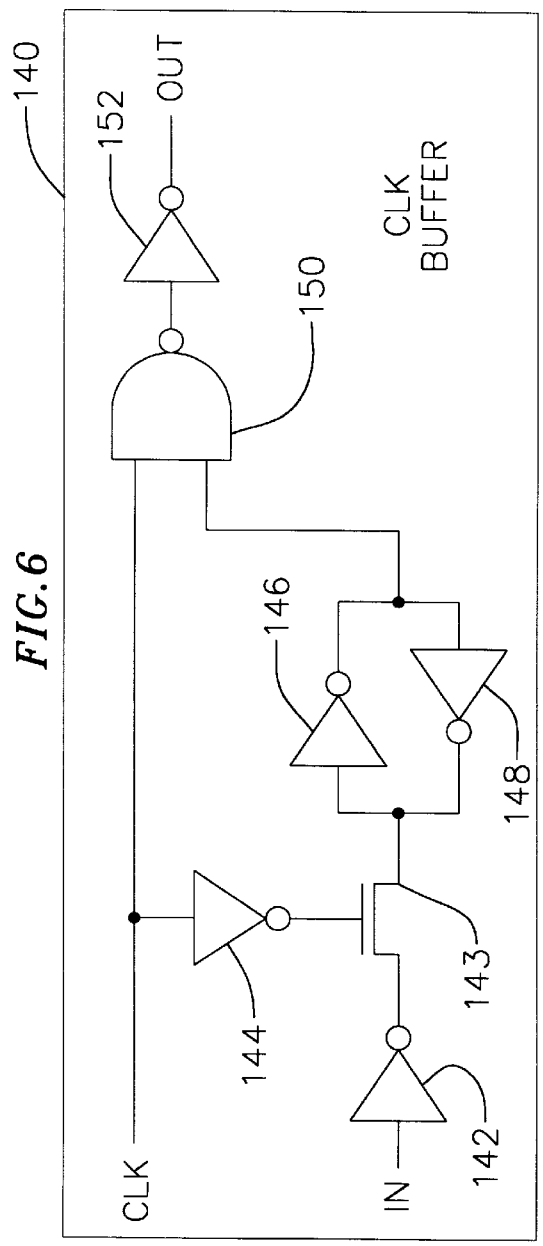
FIG. 6 is a schematic of one embodiment of the clock buffer of FIG. 2.

In FIG. 6, the clock buffer 140 of FIG. 2 is shown. The clock buffer input, the output of the clock trigger signal generating circuit in FIG. 5, is coupled to an input of an inverter 142. An output of the inverter 142 is coupled to a drain of a transistor 143. A source of the transistor 143 is coupled to an input of an inverter 146 and an output of an inverter 148. The inverters 146 and 148 comprise a latch.

The external clock signal 3 is coupled to an input of an inverter 144 and a first input of a two-input NAND gate 150. An output of the inverter 144 is coupled to a gate of the transistor 143. An output of the inverter 146 and an input of the inverter 148 are coupled to a second input of the two-input NAND gate 150. An output of the two-input NAND gate 150 is coupled to an input of an inverter 152.

The input of the inverter 142, the clock trigger signal, contains information of how many external clock cycles are to be block out during the generation of the internal clock signal 7. The output of the inverter 142 is the internal clock signal 7 from which one or more of the external clock cycles are blocked out.

Figure 7:
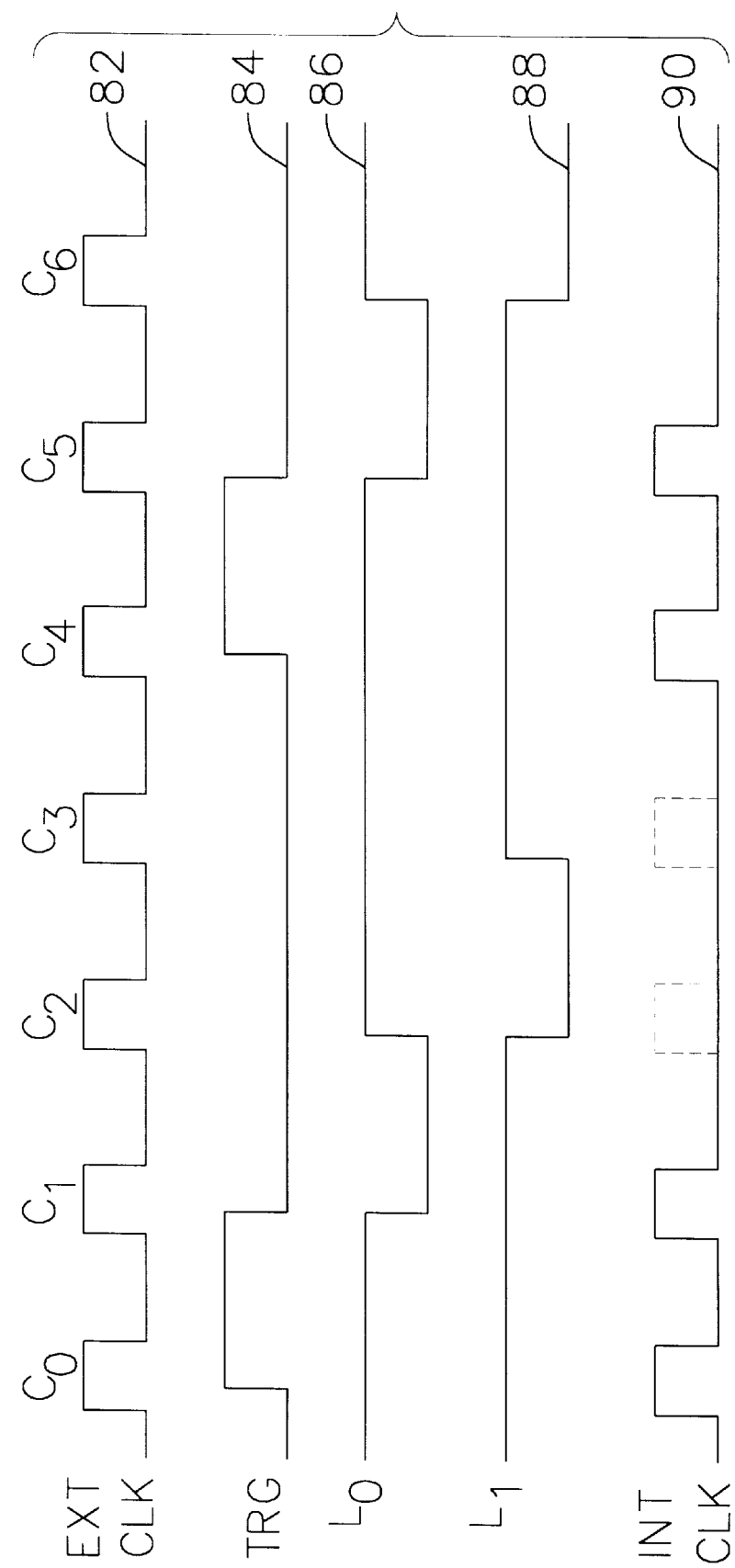
FIG. 7 is a timing diagram illustrating relationships between different signals using the clock control circuit of FIG. 2.

FIG. 7 is a timing diagram that summarizes the operation of the clock control circuit 2 of FIGS. 2–6. An external clock signal timing diagram 82, a trigger signal timing diagram 84, a first time delayed trigger signal 86, a second time delayed trigger signal 88 and an internal clock signal timing diagram 90 are shown.

As seen from the timing diagrams, when the trigger signal 5 goes high, a first time delayed trigger signal $L_0$ goes low at a rising edge of the external clock signal 3. When the first time delayed trigger signal $L_0$ is low, a second time delayed trigger signal $L_1$ goes low with the rising edge of the external clock signal 3. When both time delayed signals $L_0$ and $L_1$ are implemented using clock block signals B1 and B2, two adjacent clock cycles are blocked out from the internal clock signal 7 with respect to the external clock signal 3. Hence, as illustrated in FIG. 7, the internal clock signal resembles or is synchronized to the external clock signal. However, the internal clock signal 7 contains a two missing clock cycles. By removing clock cycles, additional time is provided for read or data sensing operations.

II(a). Data Timing Control Circuit

Figure 8:
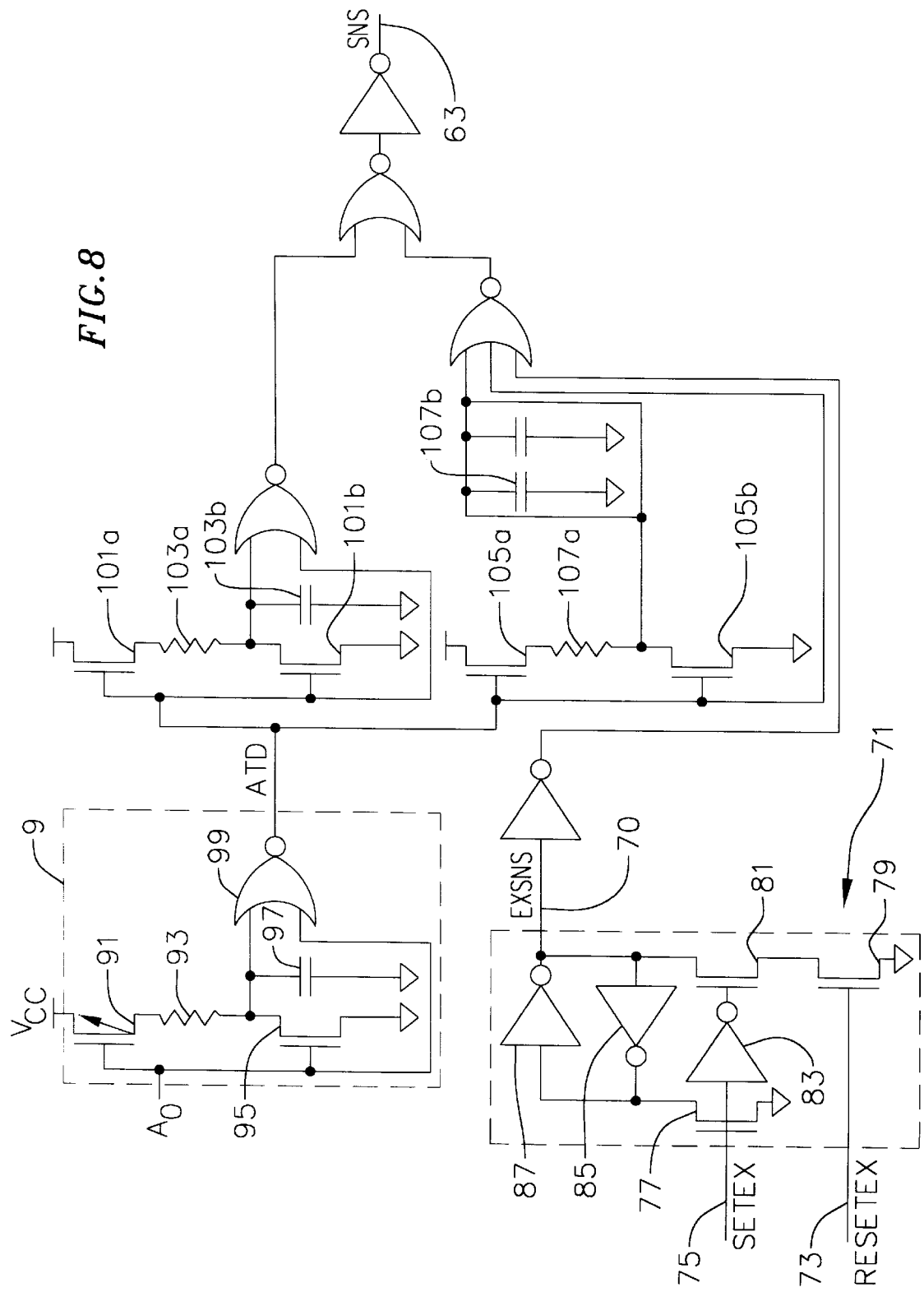
FIG. 8 is a schematic of one embodiment of the data timing circuit of FIG. 1.

The internal clock signal 7 provides additional time, i.e. more clock cycles in reference to the external clock signal, to the sense amplifiers for data sensing, i.e. read data from the memory cells through the use of a data timing control circuit. FIG. 8 illustrates a data timing control circuit 15 that generates a data sense signal 63. The data timing control circuit 15 is coupled to an extended data circuit 71 and an ATD circuit 9. The ATD circuit 9 is supplied an $A_o$ signal, the least significant bit of the address signals from the address sequencer. The address sequencer generates a pulse, the $A_o$ signal, upon each address increment.

The ATD circuit 9 has a p-channel transistor 91 and a n-channel transistor 95. Connected to the drain of the p-channel transistor 91 is a reference voltage $V_{cc}$ and connected to a source of the p-channel transistor 91 is a resistor 93. Connected to the other end of the resistor 93 is the drain of the n-channel transistor 91, one end of a capacitor 97 and a first input to a two-input NOR gate 99. The $A_o$ signal is supplied to gates of both, the p-channel transistor 91 and the n-channel transistor 95. These two transistor together act as an inverter to invert the $A_o$ signal. For instance, if the $A_o$ signal is high, the p-channel transistor 91 turns off and the n-channel transistor turns on, thus creating a path to ground. Hence, the first input of the NOR gate 99 connected to the n-channel transistor 99 is pulled to ground, i.e. low. Conversely, if the $A_o$ signal is low, the p-channel transistor 91 turns on and the n-channel transistor turns off, thus creating a path to $V_{cc}$. Hence, the first input of the NOR gate 99 connected to the n-channel transistor 99 is gradually pulled to $V_{cc}$, i.e. high.

A second input to the NOR gate 99 is coupled to the $A_o$ signal. At each transition from low to high of the $A_o$ signal, the output of the NOR gate 99, the ATD signal, is low as the first input of the NOR gate 99 is pulled to ground. Upon the transition from high to low of the $A_o$ signal, the first input of the NOR gate 99 is gradually pulled to high. During this gradual transition of the first input of the NOR gate 99 from low to high, both inputs to the NOR gate 99 are low. Therefore, the output of the NOR gate 99 goes from high to low and thus produces a rising edge for the ATD signal. The ATD signal remains high until the first input of the NOR gate 99 makes the transition and becomes high. Once the first input of the NOR gate 99 becomes high, the ATD signal goes low and thus a falling edge of the ATD signal is produced. The resistor 93 and the capacitor 97 determines a time constant which determines the time period or pulse width of the ATD signal produced. The ATD signal provides one input to the date timing control circuit 15. The other input to the data timing control circuit 15 is an extended data sense (EXSNS) signal 70.

The EXSNS signal 70 is generated by the extended data circuit 71. The logic state of EXSNS signal 70 depends on the inputs to the extended data circuit 71, an extended reset data sense (RESETEX) signal 73 and an extended set data sense (SETEX) signal 75. A set data sense buffer, illustrated in FIG. 9a, generates the SETEX signal 73 and a reset data sense buffer, illustrated in FIG. 9b, generates the RESETEX signal 75. The set data sense buffer and the reset data sense buffer are identical except for the inputs to each of the buffers. The set data sense buffer is supplied as inputs, the internal clock signal and the trigger (TRG) signal. The reset data sense buffer, on the other hand, has the internal clock signal and the $A_0$ signal as inputs.

In FIG. 9a, the internal clock (INTCLK) signal is connected to a first input of a NAND gate 901 and an input of an inverter 903. The inverter 903 is connected to a gate of the transistor switch 905. As the INTCLK signal goes low, the transistor switch 905 turns on. When the transistor switch 905 is on, output of an inverter 907 connected to a drain of the transistor switch 905 is passed to the inverters 909 and 911 through a source of the transistor switch 905. Input to the inverter 907 is connected to the TRG signal. The inverters 909 and 911 invert the signal from the source of the transistor switch 905 and supply this signal to a second input of the NAND gate 901. The inverters 909 and 911 also act as a latch to maintain the logic state at the second input of the NAND gate 901, which is basically, the TRG signal. Output of the NAND gate 901 is coupled to an input of an inverter 913. Output of the inverter 913 is the SETEX signal 73. With the INTCLK signal low and the output of the NAND gate 901 high, the SETEX signal 73 is low.

As the INTCLK signal goes high, the transistor switch 905 turns off and the first input of the NAND gate 901 is also high. Therefore, when the INTCLK signal goes high, the signal at the second input of the NAND gate 901 which is basically the TRG signal is "clocked" through to set the logic state of the SETEX signal 73. Therefore, if the TRG signal was low prior to the INTCLK signal going high, the SETEX signal is also low. However, if the TRG signal was high prior to the INTCLK signal going high, the SETEX signal goes high. Therefore, the SETEX signal goes high at the rising edge of the INTCLK and when the TRG signal is high and the SETEX signal goes low at the falling edge of the INTCLK and when the TRG signal goes low.

As previously mentioned, the reset data sense buffer in FIG. 9b is similar to the set data sense buffer in FIG. 9a, described above, except for the inputs to the buffers. Therefore, the RESETEX signal 75 is generated in the same fashion as the SETEX signal. However, the $A_0$ signal effects the logic state of the RESETEX signal 75. Therefore, as the INTCLK signal goes high, the $A_0$ signal is "clocked" through to set the logic state of the RESETEX signal 75. If the $A_0$ signal is low prior to the INTCLK signal going high, the RESETEX signal is also low. However, if the $A_0$ signal is high prior to the INTCLK signal going high, the RESETEX signal goes high. Therefore, the RESETEX signal goes high at the rising edge of the INTCLK and when the $A_0$ signal is high and the RESETEX signal goes low at the falling edge of the INTCLK and when the $A_0$ signal goes low.

Referring back to FIG. 8, the RESETEX signal 75 and the SETEX signal 73 are supplied as inputs to the extended data circuit 71. The SETEX signal 73 is coupled to a gate of a first transistor 77 and an input of an inverter 83. An output of the inverter 83 is coupled to the gate of a second transistor 81. When the SETEX signal goes high, the first transistor 77 turns on and the second transistor 81 turns off, due to the intervening inverter 83. A source of the first transistor 77 is coupled to ground and a drain of the first transistor 77 is coupled to inverters 85 and 87. The EXSNS signal 70 is an output of the inverter 87. The inverters 85 and 87 act as a latch and maintain the logic state at the drain of the first transistor 77. Therefore, as the first transistor turns on, a path to ground is developed and the EXSNS signal 70 goes high.

Conversely, as the SETEX signal goes low, the first transistor 77 turns off and the second transistor 81 turns on. The RESETEX signal 73 is coupled to a gate of a third transistor 79. This third transistor 79 has a source that is coupled to ground and a drain that is coupled to a source of the second transistor 81. A drain of the second transistor is coupled to the inverters 85 and 87 and also acts as a second source to supply the EXSNS signal 70. With the SETEX signal 75 low, if the RESETEX signal 73 goes high, then a path to ground is developed. Therefore, the EXSNS signal 70 is pulled to ground and goes low.

The EXSNS signal 70 is supplied to the data timing control circuit 15 and is combined with the ATD signal from the ATD circuit 9 to produce the data sense signal 63. In FIG. 8, the transistors in the data timing control circuit 15 operate in a similar fashion as the transistors of the ATD circuit 9, previously described. Therefore, the transistors 101a and 101b and the transistors 105a and 105b receiving the ATD signal act as inverters. The resistors 103a and 107a along with the capacitors 103b, 107b, and 107c, also operate similarly to the resistor 93 and capacitor 97 of the ATD circuit 9, i.e. producing a RC delay or time constant. However, with the addition of the capacitor 107c, the delay experienced at inputs of NOR gate 109b is longer than the delay experienced at inputs of NOR gate 109a. However, these delays only become noticeable when the EXSNS signal 70 goes high.

When the EXSNS signal 70 is high, output of the NOR gate 109b goes high, if the other inputs of the NOR gate 109b is low. If the inputs of the NOR gate 109b are low, inputs to the NOR gate 109a is also low, due to the similarity in the components and interconnection of components coupled to the NOR gate 109a. With the inputs of the NOR gate 109a low, output of the NOR gate 109a goes high. With both outputs of the NOR gates 109a,b which are also inputs of a NOR gate 111, going high, the SNS signal 63 also goes high.

Similarly, when the EXSNS signal 70 goes low, output of the NOR gate 109b goes low. The inputs to the NOR gate 109a is also low and thus the output of the NOR gate 109a goes high. With both outputs of the NOR gates 109a,b which are also inputs of a NOR gate 111, low, the SNS signal 63 also goes low.

Figure 10:
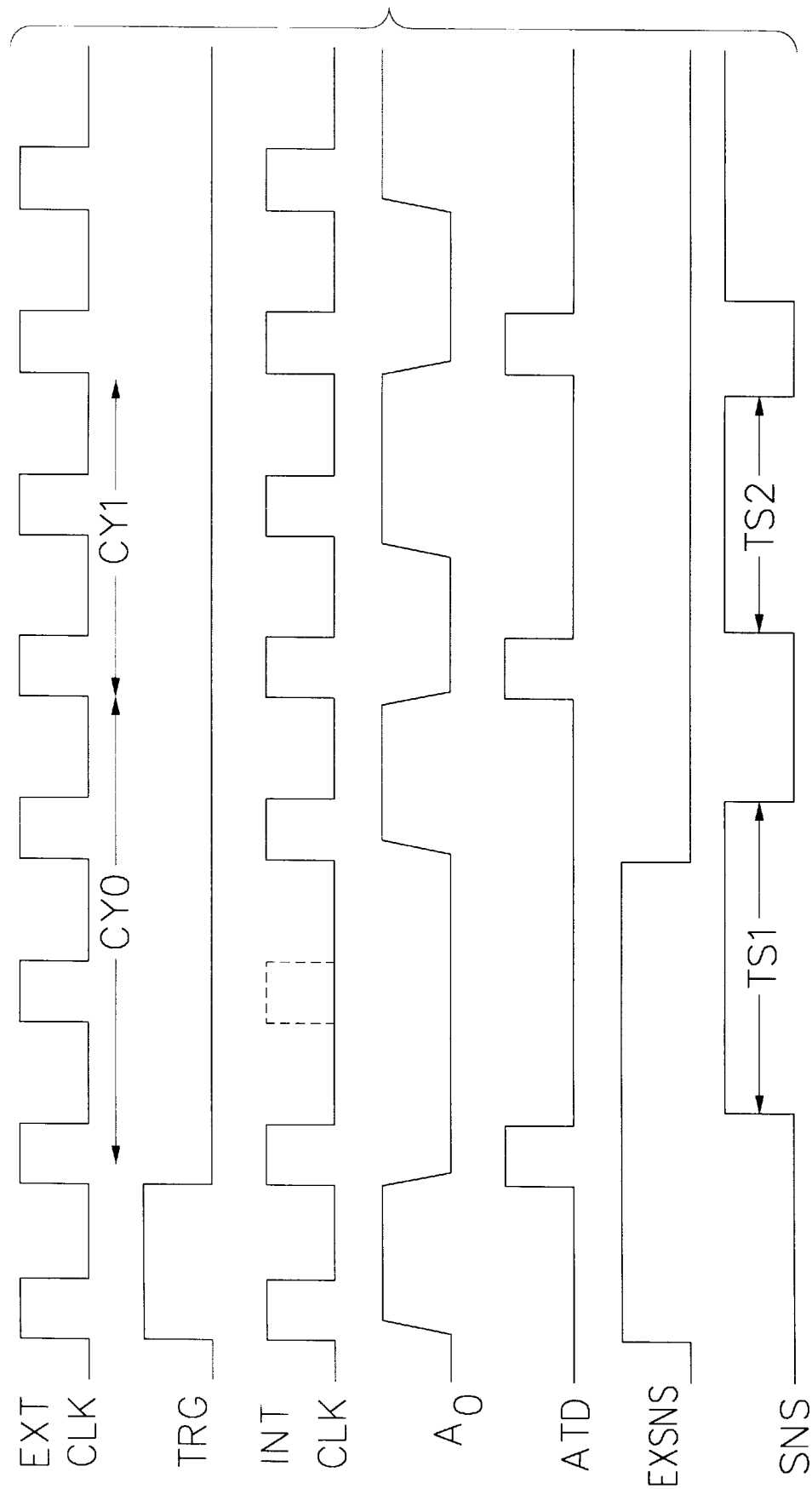
FIG. 10 is a timing diagram illustrating the interaction between different signals using the data timing circuit of FIG. 8.

In FIG. 10, timing diagrams of the EXSNS signal, the TRG signal, the $A_0$ signal, the ATD signal, the SNS signal, and the internal and external clock signals illustrate the interaction of these signals and the operation of the data timing control circuit 15. Since, the internal clock signal provides the input to the address sequencer, the $A_0$ signal depends on the state of the INTCLK signal. Therefore, the $A_0$ signal switches, i.e changes state, upon every rising edge of the INTCLK signal. The ATD signal from the ATD circuit 9, depending on the state of the $A_0$ signal, is generated at the falling edge of the $A_0$ signal. The ATD signal marks the start of the transition from one address to another. The SNS signal 63 acts to control the sense amplifiers such that during the periods TS1 and TS2, the sense amplifiers are triggered to read the memory cells at the rising edge of the SNS signal. As described in reference with FIG. 8, the time duration of the periods TS1 and TS2 are controlled by the resistors 107a and the capacitors 107b,c. Therefore, if more time is required for data sensing, additional capacitance is added to extend the time duration of the periods TS1 and TS2.

The sense amplifiers are triggered to stop reading the memory cells at the falling edge of the SNS signal. It is assumed that for a standard read operation, the sense amplifiers are allowed two external clock cycles to read the memory cell. In FIG. 10, when the TRG signal is high, at the rising edge of the external clock signal, the next internal clock cycle is skipped. As illustrated earlier in reference to FIG. 7, when the TRG signal is high, a boundary crossing is encountered. When a boundary crossing is encountered, the sense amplifiers needs additional time to read the data. Since the INTCLK signal is supplied to the address sequencer to control the incrementing of the addresses, the $A_0$ signal does not change until the rising edge of the INTCLK signal. If the $A_0$ signal does not change then the ATD signal is not generated. If the ATD signal is not generated and the $A_0$ signal does not change, the SNS signal remains high and the sense amplifiers continue reading data from the memory cells. Therefore, by delaying the internal clock signal by an extra external clock cycle, the sense amplifiers is provided additional time to perform read operations.

III. Decoder Circuits

Figure 11:
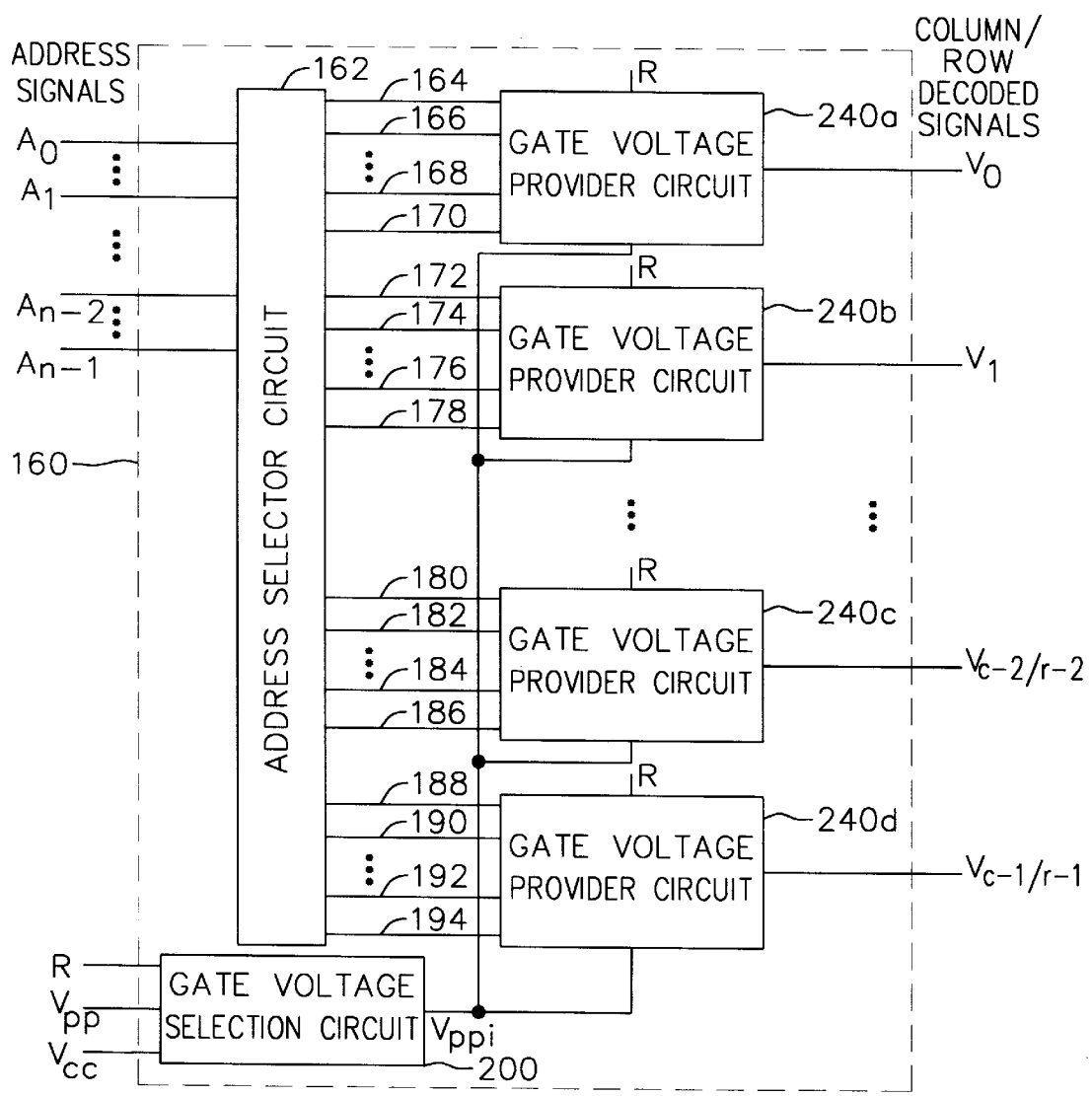
FIG. 11 is a block diagram of an address decoder circuit which is used as both a row decoder circuit and a column decoder circuit.

As illustrated earlier in reference to FIG. 1, the column and row decoders 6 and 8 generate column and row decoded signals based on the address signals generated by the address sequencer 4. One embodiment of a decoder circuit of the present invention in FIG. 11 with isolated high voltage and lower voltage portions is used as a column or a row decoder circuit 24 and 26 illustrated in FIG. 1. The address signals $A_0 \ldots A_{n-1}$ are provided as input from the row buffer 8 or the column buffer 6 as shown in FIG. 1. In FIG. 11, an address selector circuit 162 inverts zero or more of the address signals $A_0 \ldots A_{n-1}$ as needed prior to providing these signals to each of the gate voltage provider circuits 240a, 240b, 240c and 240d. When the address signals $A_0 \ldots A_{n-1}$ are indicative of a selection of a particular gate voltage provider circuit, zero or more of the address signals $A_0 \ldots A_{n-1}$ are inverted to apply logic "high" at all signal inputs for that particular gate voltage provider circuit.

For example, if the gate voltage provider circuit 240a is to be selected when all the address signals $A_0 \ldots A_{n-1}$ are logic "low", all of the signals 164, 166, 168 and 170 provided to the gate voltage provider circuit 240a are inverted at the address selector circuit 162 so that all the signals 164, 166, 168 and 170 applied at the input of the gate voltage provider circuit 240a are logic "high" when applied. For another example, if the gate voltage provider circuit 240d is to be selected when all the address signals $A_0 \ldots A_{n-1}$ are logic "high", none of the signals 188, 190, 190 and 192 provided to the gate voltage provider circuit 240d are inverted at the address selector circuit 162 so that all the signals 188, 190, 190 and 192 applied at the input of the gate voltage provider circuit 240d are logic "high" when applied.

Figure 12A:
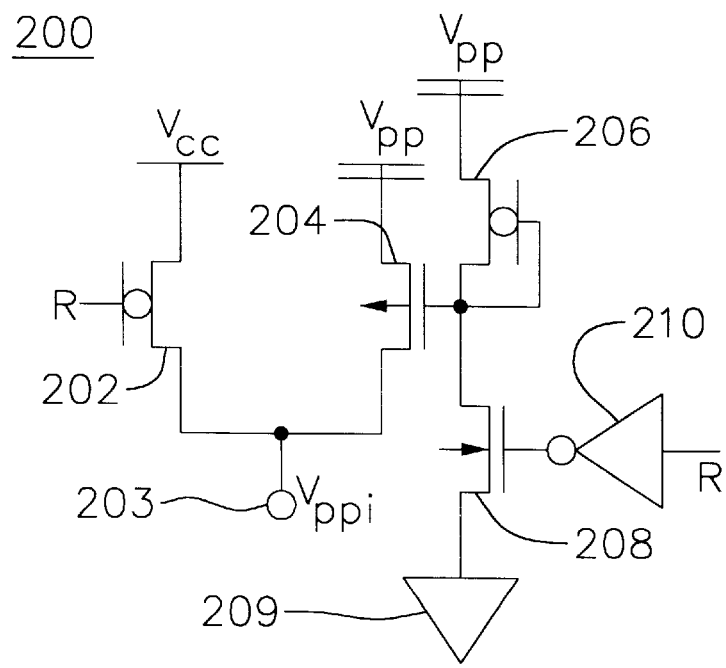
FIG. 12(A) is a gate voltage selection circuit of a conventional address decoder circuit.
Figure 12B:
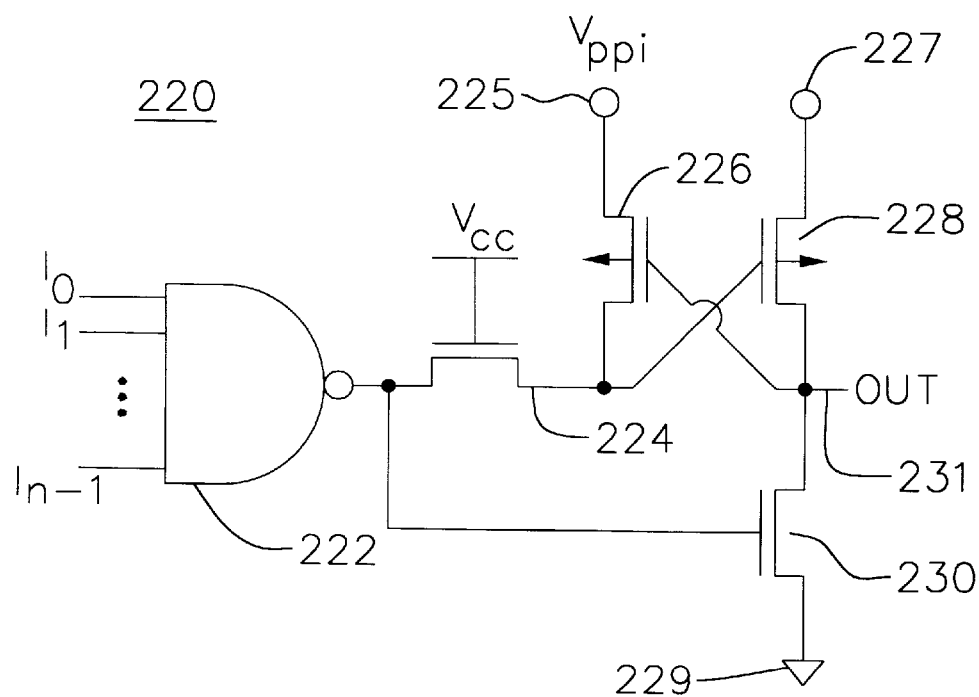
FIG. 12(B) is a one gate voltage provider circuit of a conventional address decoder circuit.

FIGS. 12(A) and 12(B) are conventional circuits used as the gate voltage selection circuit 200 and the gate voltage provider circuits 240a–240d of the address decoder circuit of FIG. 11, respectively. FIG. 12(A) shows a gate voltage selection circuit 200 which outputs a voltage output $V_{ppi}$ 203. A voltage level of the voltage output $V_{ppi}$ 203 is either $V_{cc}$ or $V_{pp}$, and depends on a read signal R. The read signal R is generated by the system using the synchronous flash memory device and provided to the synchronous flash memory device when the read operation is needed.

The read signal R is coupled to a gate of a depletion mode N-channel transistor 202. A drain of the depletion mode N-channel transistor 202 is coupled to $V_{cc}$, and a source of the depletion mode N-channel transistor 202 is coupled to the voltage output 203 $V_{ppi}$. The read signal R is also coupled to an input of an inverter 210. An output of the inverter 210 is coupled to a gate of a P-channel transistor 208. A source of the P-channel transistor 208 is coupled to a common 209. A drain of the P-channel transistor 208 is coupled to a gate of an enhanced mode N-channel transistor 204. A drain of the enhanced mode N-channel transistor 204 is coupled to $V_{pp}$.

A drain of the P-channel transistor 208 is also coupled to a source and a gate of a depletion mode N-channel transistor 206. The gate of the enhanced mode N-channel transistor 204 is coupled to the drain of the P-channel transistor 208. The enhanced mode N-channel transistor 204 is a high voltage transistor having thick oxide layer and low conductivity since it needs to handle the high gate program voltage $V_{pp}$.

The read signal R goes high during the read operation. When the read signal R is high, the N-channel transistor 202 turns on and a voltage at the source of the transistor 202 becomes close to $V_{cc}$. Therefore, the voltage output $V_{ppi}$ 203 becomes close to $V_{cc}$. When the read signal R is high, the output of the inverter 210 becomes low. When the output of the inverter 210 goes low, the P-channel transistor turns on, supplying a near ground potential to the gate and the source of the enhanced mode N-channel transistor 206. The near ground potential is also applied at the gate of the depletion mode N-channel transistor 204, turning it off, thus preventing it from providing $V_{pp}$ to the voltage output $V_{ppi}$ 203.

When the read signal R goes low during the program operation, the depletion mode N-channel transistor 202 is turned off, thus preventing it from providing $V_{cc}$ to the voltage output $V_{ppi}$ 203. When the read signal R is low, the output of the inverter 210 goes high, thus turning off the P-channel transistor 208. The enhanced mode N-channel transistor 204 is turned on, and the program drain voltage $V_{pp}$ is provided to the voltage output $V_{ppi}$ 203.

Both column decoder circuit 24 and the row decoder circuit 26 comprise a plurality of the gate voltage provider circuits 220 of FIG. 12(B), one per output, because each gate voltage provider circuit provides necessary voltage to a specific column control transistor or a specific row of memory cells.

In the gate voltage provider circuit 220, the signals from the address selector circuit 162 are inputted into a NAND gate 222 as input signals. An output of the NAND gate 222 is coupled to a drain of an N-channel transistor 224 and a gate of an N-channel transistor 230. A gate of the N-channel transistor 224 is coupled to $V_{cc}$. A source of the N-channel transistor 224 is coupled to a source of a P-channel transistor 226 and a gate of a P-channel transistor 228.

Drains of the P-channel transistors 226 and 228 are coupled to $V_{ppi}$ input terminals 225 and 227, respectively. The $V_{ppi}$ input is provided by the gate voltage selection circuit 200. A gate of the P-channel transistor 226, a source of the P-channel transistor 228 and a drain of the N-channel transistor 230 are coupled to an output voltage 231 of the gate voltage provider circuit 220. A source of the N-channel transistor 230 is coupled to a common 229.

When a specific gate voltage provider circuit 220 is not selected, at least one of the input signals $I_0 \ldots I_{n-1}$ to the NAND gate 222 is logic "low". When at least one input to the NAND gate 222 is logic "low", the output of the NAND gate 222 is logic "high". When the output of the NAND gate 222 is logic "high", the N-channel transistor 230 turns on, pulling the output voltage 231 down to nearly ground of the common 229. When the output voltage 231 is pulled low, the P-channel transistor 226 turns on, providing a logic "high" voltage at the gate of the P-channel transistor 228, thus preventing it from providing a high voltage at the output 231. Therefore, the gate voltage provider circuit 220 does not provide an output voltage for read or program operation when it is not selected.

When a specific gate voltage provider circuit 220 is selected, all of the input signals $I_0 \ldots I_{n-1}$ are logic "high", and the output of the NAND gate 222 is logic "low". The low logic applied at the gate of the N-channel transistor 230 turns it off, so that the output 231 is not pulled low. The logic "low" from the output of the NAND gate 222 is applied at the gate of the P-channel transistor 228 through the N-channel transistor 224. The N-channel transistor 228 turns on and pulls the output 231 high to $V_{pp}$ or $V_{cc}$, depending on a voltage level of the $V_{ppi}$ 227.

Since the transistors 226, 228 and 230 must handle $V_{pp}$, they are high voltage transistors with a thick oxide layer and a relatively low conductivity. When $V_{cc}$ is lower than typical, a conductivity of the P-channel transistor 228 becomes really low, and this results in a slow read operation. As a result, the transistor 202 which provides $V_{cc}$ to the $V_{ppi}$ 203 must be large.

Figure 13:
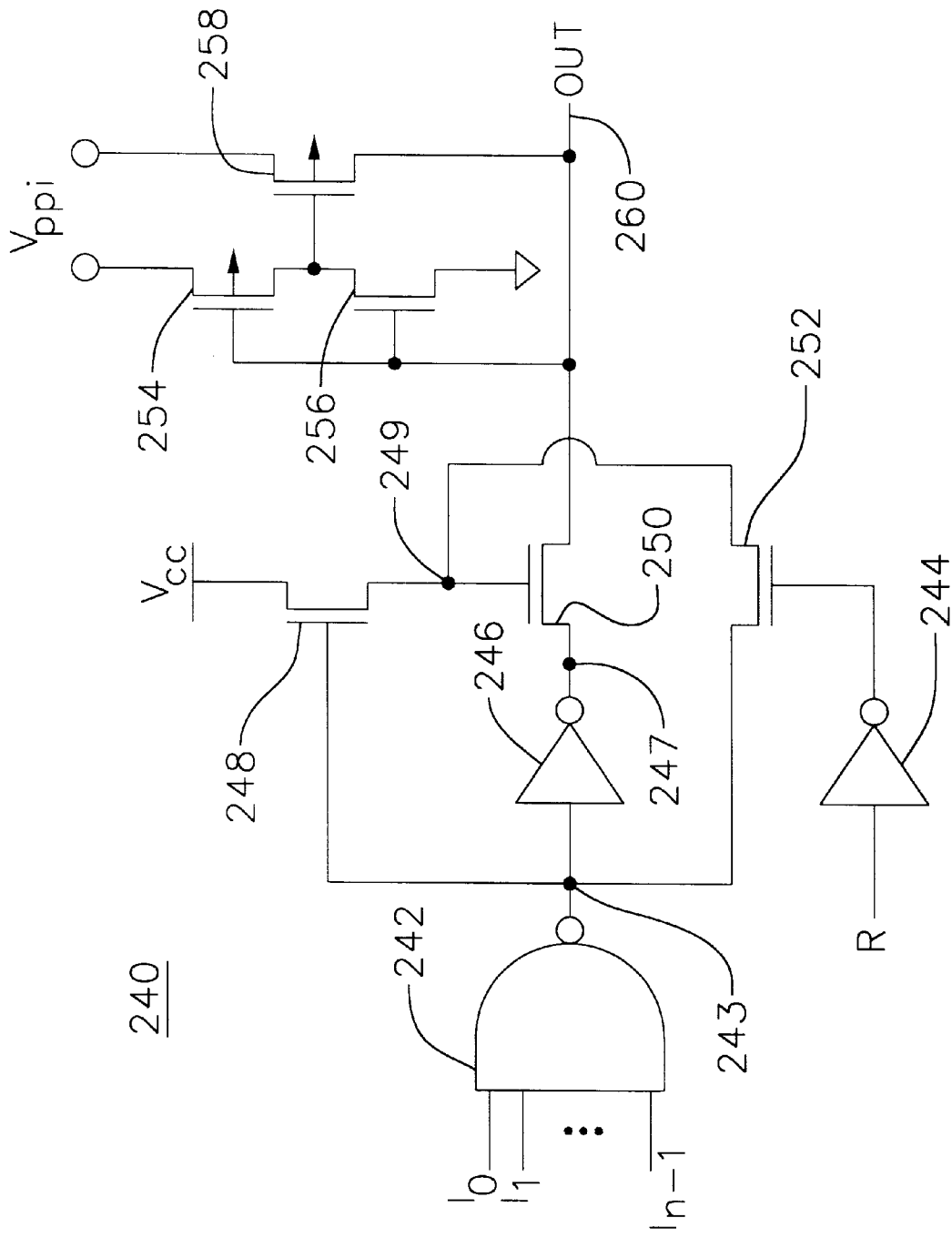
FIG. 13 is a one gate voltage provider circuit of the present invention.

In FIG. 13, one embodiment of a gate voltage provider circuit 240 of the present invention is illustrated having a separate high voltage portion and a separate lower voltage portion. The lower voltage portion of the gate voltage provider circuit performs the operations requiring fast switching. In the gate voltage provider circuit 240, a NAND gate 242, when the gate voltage provider circuit 240 is selected, receives the input signals in an identical manner as the NAND gate 222 of the conventional circuit.

An output 243 of the NAND gate 242 is coupled to a gate of an N-channel transistor 248, an input of an inverter 246, and a drain of an N-channel transistor 252. An output 247 of the inverter 246 is coupled to a drain of an N-channel transistor 250. A gate of the N-channel transistor 250 is coupled to a source of the N-channel transistor 248 and a source of the N-channel transistor 252. A source of the N-channel transistor 250 is coupled to an output voltage 260 of the gate voltage provider circuit. A read signal R is provided at an input of an inverter 244. An output of an inverter 244 is applied at a gate of the transistor 252. The transistors 248 and 250 are low voltage N-channel transistors with a threshold voltage of 0V. The N-channel transistor 250 is used to isolate the high voltage portion from the lower voltage portion.

When a specific gate voltage provider circuit is not selected, the output 243 of the NAND gate 242 is high, and therefore, the output 247 of the inverter 246 is low. The N-channel transistor 248 turns on and consequently, the N-channel transistor 250 turns on and node 249 goes high. Therefore, the low output from the inverter 246 is outputted as the output of the specific gate voltage provider circuit. When the low output of the gate voltage provider circuit is applied at the gates of the transistors 254 and 256, which operate as an inverter, the P-channel transistor 254 turns on, applying $V_{ppi}$ at the gate of the P-Channel transistor 258, and the N-channel transistor 256 turns off. As a result, the P-channel transistor 258 turns off and $V_{ppi}$ is not provided at the output 260.

When a specific gate voltage provider circuit is selected, the output 243 of the NAND gate 242 is low, and therefore, the output 247 of the inverter 246 is high. When the read signal R is high, indicating the read operation, the output of the inverter 244 is low, thus turning off the N-channel transistor 252. The output 260 is pulled high to $V_{ppi}$.

Because of channel capacitance of the N-channel transistor 250, the node 249 of the gate of the N-channel transistor 250 is coupled high, keeping high conductivity of the N-channel transistor 250. Since the inverter 246 is formed with high conductivity transistors, the output 260 is driven strongly, and thus results in a fast operation for read. In addition, the inverter 246 by producing a high output does not cause the $V_{ppi}$ voltage to drop. Therefore, the depletion mode N-channel transistor 202 of the gate voltage selection circuit in FIG. 12a does not have to be large to compensate for any voltage drop in $V_{ppi}$.

When a specific gate voltage provider circuit is selected and when the read signal R is low, indicating a program operation, the output of the inverter 244 is high, thus turning on the N-channel transistor 252. The N-channel transistor 248 gradually turns off as node 249 is pulled low. As described above in reference with the read operation, the output 260 is pulled high to $V_{ppi}$. However, the N-channel transistor 248, by turning off acts as a buffer to isolate the low voltage portion of the gate voltage provider circuit from the high voltage portion of the gate voltage provider circuit. Therefore, program voltage, i.e. high voltage as compared to a read voltage, is provided at the output 260 without effecting the low voltage portion of the gate voltage provider circuit.

IV. Address Sequencer

As illustrated in FIG. 1, the address sequencer 4 receives the internal clock signal 7 from the clock control circuit 2. The address sequencer provides the trigger signal 5 to the clock control circuit. The address sequencer also provides address signals to the row and column buffers 6 and 8. In addition, the address sequencer provides the address signal $A_0$ representing the least significant address bit to the ATD circuit 9.

The address sequencer 4 sequentially increments addresses. Each sequential increment of an address is synchronized with the rising edge of the internal clock signal 7. Each address generated by the address sequencer 4 is a compilation of address signals. The address signals are individually generated by the address sequencer 4 using a series of toggle signals.

Figure 14:
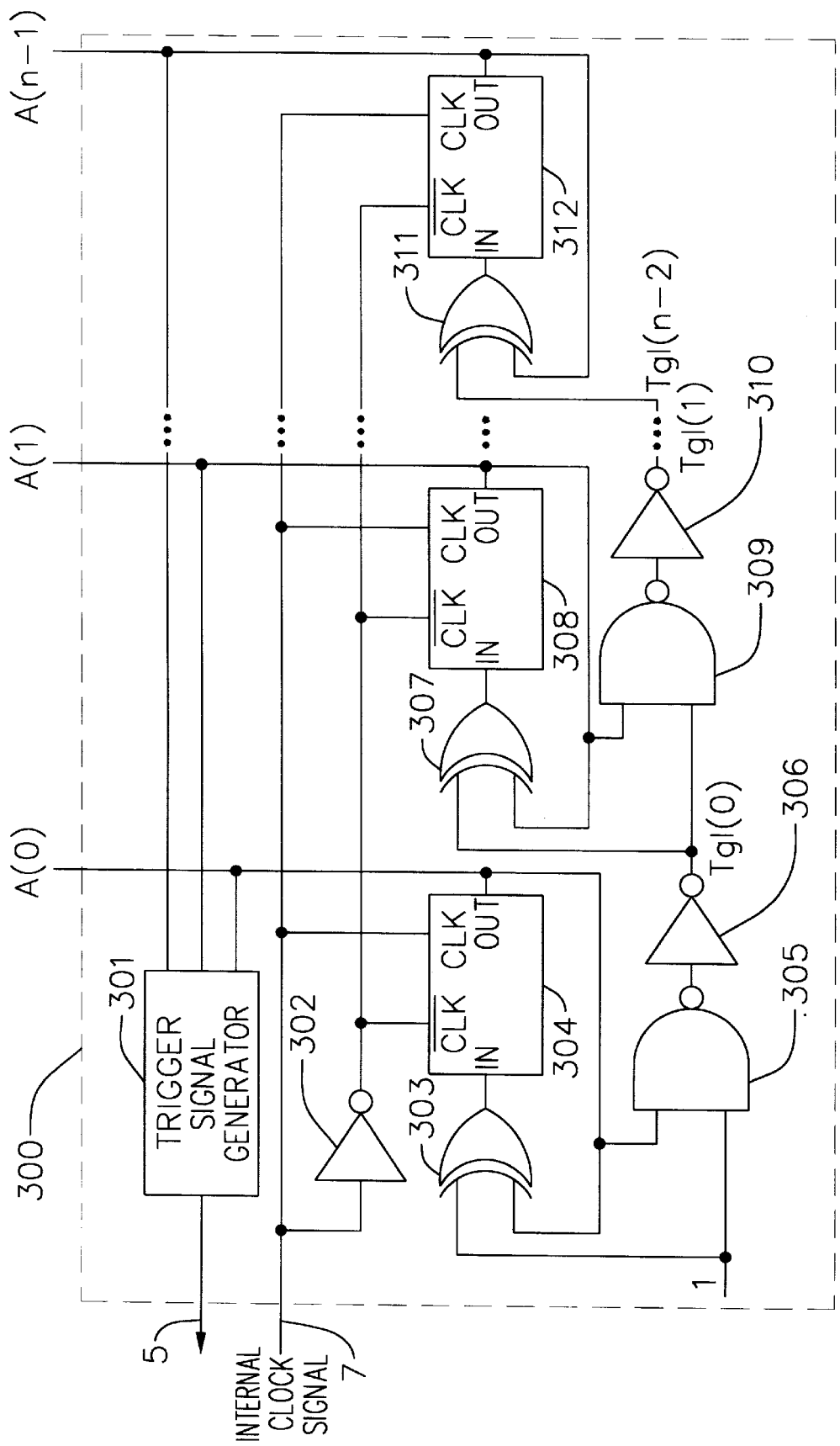
FIG. 14 is an address sequencer of the present invention.

FIG. 14 is a block diagram of an embodiment of the address sequencer 300($a$) of the present invention. The address sequencer comprises a series of address signal generators. The address signal generators generate address signals $A_0, A_1, \ldots, A_{n-1}$. In FIG. 14 only address signal generators generating address signals $A_0$, $A_1$, and $A_{n-1}$ are shown for clarity. Thus, as illustrated in FIG. 14, a first address signal generator 304 generates a first address signal $A_0$. Similarly, a second address signal generator 308 generates a second address signal $A_1$. Finally, an $n_{th}$ address signal generator 312 generates an $n_{th}$ address signal $A_{n-1}$.

The address signal generator 304 is an even address signal generator which generates an even address signal. The address signal generator 308 is an odd address signal generator which generates an odd address signal.

The address signal generators act as latches, i.e., shift registers, which clock out input signals based on clock signal changes. The address signal generator includes two latches, a first of which is provided an inverse of a clock signal and a second of which is provided the clock signal. Accordingly, each address signal generator is provided a differential clock signal. The differential clock signal is comprised of an internal clock signal 7 and an inverse internal clock signal 7a. The inverse internal clock signal is formed by passing the internal clock signal through an invertor 302. The input signal is clocked into the first latch on a rising edge of the clock signal, and the input signal is clocked into the second latch on a rising edge of the clock signal.

The address signal generators 304, 308 and 312 are also provided input signals provided by two-input XOR gates 303, 307 and 311, respectively. A first input of the XOR gate 303, which provides the input signal to the first address signal generator, is coupled to a logic "1". A second input of the XOR gate 303 is coupled to an output of the first address signal generator 304, i.e., the address signal $A_0$. Accordingly, every rising edge of the clock signal causes the address signal $A_0$ to toggle between a logic "0" and a logic "1".

The address signal $A_0$ is also coupled to a first input of a NAND gate 322. The second input of the NAND gate 322 is coupled to a logic "1". The output of the NAND gate 322, therefore, provides an inverse of a first toggle signal $\overline{Tgl}_{(0)}$, which is the inverse of the address signal $A_0$. Thus, the XOR gate 303 and the NAND gate 322 represent an even toggle logic cell associated with the even address signal generator 304. In other words, the toggle logic cell associated with the even address signal generator 304 generates the inverse of the first toggle signal $\overline{Tgl}_{(0)}$.

The inverse of the first toggle signal $\overline{Tgl}_{(0)}$, which is provided by the NAND gate 322, is coupled to a first input of the XOR gate 307 through an inverter 324. The inverter 324 provides the input to the address signal generator 308 through an inverter 324. The inverse of the first toggle signal $\overline{Tgl}_{(0)}$ is also provided as a first input of a NOR gate 328. An address signal $A_1$ generated by the address signal generator 308 is coupled to a second input of the XOR gate 307 and a second input of the NOR gate 328 through an inverter 326. Therefore, when the address signal $A_0$ is 1, the address signal $A_1$ does not toggle. However, when the address signal $A_0$ is 0, the address signal $A_1$ toggles from 0 to 1 or 1 to 0.

An output of the NOR gate 328 is the second toggle signal $Tgl_{(1)}$. Thus, a toggle logic cell associated with the address signal generator 308 generates a second toggle signal $Tgl_{(1)}$, which is an odd toggle signal. The toggle logic cell associated with the address signal generator 308 is an odd toggle logic cell which is represented by the XOR gate 307, the inverters 324, 326 and the NOR gate 328.

A first input of an XOR gate 311 is coupled to a $(n-1)_{th}$ toggle signal $Tgl_{(n-2)}$. A second input of the XOR gate 311 is coupled to an address signal $A_{n-1}$ generated by the address signal generator 312. The address signal generator 312 generates the address signal which represents the most significant address bit. An inverter 330 indicates that the address signal generator 312 is an odd address signal generator for inverting an inverse toggle signal. However, the address signal generator 312 may be an even address signal generator depending on the number of address bits represented by the address signals. When the address signal generator 312 is an even address signal generator, the inverter 330 is not present.

Since the address signal generator 312 generates the address signal $A_{n-1}$ representing the most significant bit, the address signal generator 312 is the last address signal generator generating the last address signal. As such, once the last address signal is generated by the address signal generator 312, there are no more address signals to generate. Therefore, the address signal generator 312 is not associated with any of the even or odd toggle logic cells since the toggle logic cells associated with any specific address signal generator is used to generate address signals that represent more significant bits than the address bit represented by the address signal generated by the specific address signal generator.

The address sequencer also provides the trigger signal 5 to the clock control circuit 2 for initiating the inhibition of clock cycles in the internal clock signal as previously described in reference to FIGS. 2–7. In one embodiment of the present invention, the trigger signal 5 is one of the toggle signals. The trigger signal may be the fifth toggle signal $Tgl_{(4)}$.

In other embodiments, the trigger signal 5 is generated for the initiation or manipulation of other operations of the flash memory device. In another embodiment, a trigger signal generator is coupled to the address signals $A_0$–$A_{n-1}$. Using the address signals $A_0$–$A_{n-1}$, the trigger signal generator generates the trigger signal 5.

Figure 15A:
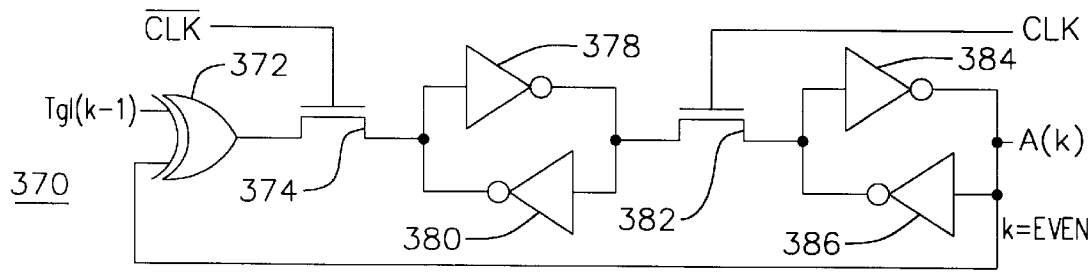
FIG. 15(a) is one embodiment of improved address signal generators of the present invention for even address signals.
Figure 15B:
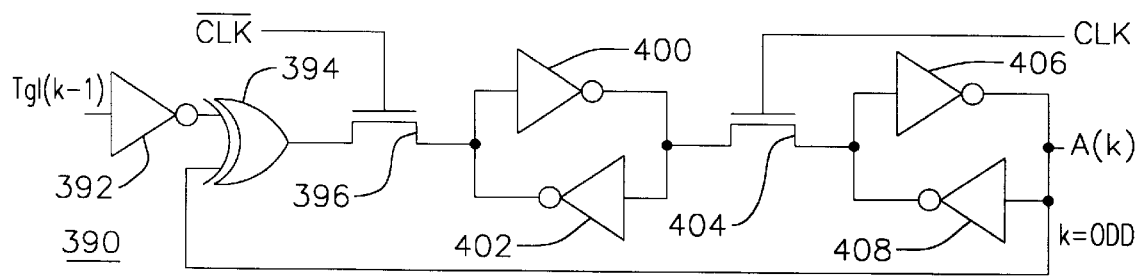
FIG. 15(b) is one embodiment of improved address signal generators of the present invention for odd address signals.
Figure 15C:
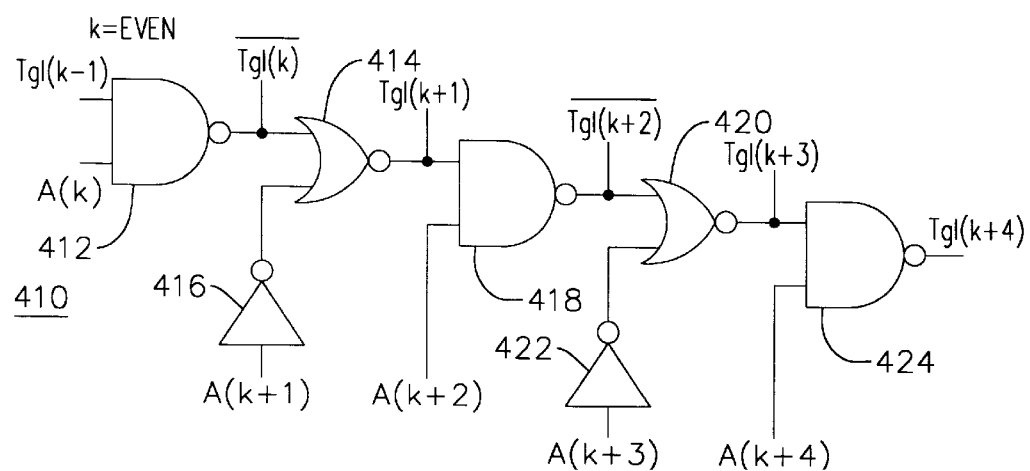
FIG. 15(c) is a signal delay path for generation of address signals using an address signal generator of the present invention.

FIG. 15(c) illustrates logic gates linked in series which form a delay path encountered during generation of address signals. The logic gates cause sequential gate delays. In other words, a sequential gate delay associated with each address signal is the sum of all gate delays in the delay path encountered during generation of that address signal. A first input of a NAND gate 412 is a toggle signal $Tgl_{(k-1)}$. An output of the NAND gate 412 is coupled to a first input of a NOR gate 414. An output of the NOR gate 414 is coupled to a first input of a NAND gate 418. An output of the NAND gate 418 is coupled to a first input of a NOR gate 420. An output of the NOR gate 420 is coupled to a first input of a NAND gate 424.

Second inputs of the NAND gates 412, 418 and 424 are coupled, respectively, to address signals $A_k$, $A_{K+2}$ and $A_{K+4}$ from associated address signal generators (not shown). Second inputs of the NOR gates 414 and 420 are coupled, respectively, to address signals $A_{K+1}$ and $A_{K+3}$ that are inverted by inverters 416 and 422, respectively.

In this embodiment, the NOR gate delay is approximately equal to the NAND gate delay. Therefore, for example, if the delay of a NOR or a NAND gate is $T_{an}$, the sequential gate delay associated with generation of the $21^{st}$ address signal of a 21-bit address is $J=20 \times T_{an}$.

Since the total amount of delay generally should take place within a clock period, the clock period is lower bounded by J seconds. Therefore, the clock frequency is upper bounded by 1/J Hz. By reducing the number of gate delays in the delay path of the address sequencer, the memory device is able to operate with higher frequency clocks.

For completeness, FIG. 15(a) illustrates one embodiment of an even address signal generator 371. An output toggle address signal of an XOR gate 372 is provided as an input to the address signal generator 371. The input to the address signal generator 371 is provided to a drain of a transistor 374. A first input of the XOR gate 372 is coupled to a toggle signal $Tgl_{(k-1)}$ and a second input of the XOR gate 372 is coupled to an address signal $A_k$ generated by the address signal generator 371.

A gate of the transistor 374 is coupled to an inverse clock signal $\overline{clk}$. A source of the transistor 374 is coupled to a first latch comprised of inverters 378 and 380. An output of the first latch is coupled to a drain of a transistor 382. A gate of the transistor 382 is coupled to a clock signal clk. A source of the transistor 382 is coupled to a second latch comprised of inverters 384 and 386. The output of the second latch is the generated address signal $A_k$.

In the even address signal generator 371, the input is clocked into the first latch synchronously to a falling edge of the clock signal clk, (i.e.) a rising edge of the inverse clock signal $\overline{clk}$. The contents of the first latch is clocked into the second latch synchronously to a rising edge of the clock signal clk. The contents of the second latch forms the output of the even address signal generator, which is the address signal $A_k$ as mentioned above.

Similarly for completeness, FIG. 15(b) illustrates one embodiment of an odd address signal generator 391. The odd address signal generator 391 is similar in structure to the even address signal generator 371. However, an inverter 392 is coupled at the first input of an XOR gate 394 to invert an inverse of the toggle signal $\overline{Tgl}_{(k-1)}$.

The logic gates illustrated in FIGS. 14 and 15(a)–(c) can be represented by the following Boolean equations. For even address signals, i.e., where k is even, the Boolean equations are:

$$A_k(T)=Tgl_{(k-1)}(T-1) \oplus A_k(T-1); \quad (1)$$

and a) $Tgl_{(k)}(T-1)=Tgl_{(k-1)}(T-1) \cdot A_k(T-1)$.

For odd address signals, i.e., where k is odd, the Boolean equations are:

$$A_k(T)=Tgl_{(k-1)}(T-1) \oplus A_k(T-2); \quad (1)$$

and a) $Tgl_{(k)}(T-1)=Tgl_{(k-1)}(T-1)+A_k(T-1)$.

Thus, in the embodiment of the present invention described above in reference to FIGS. 14 and 15(a)–(c), each toggle signal is used during generation of one address signal. In other words, there generally is a one-to-one correspondence between the toggle signals and the address signals. If each toggle signal is used to generate more than one address signal, the number of toggle signals generated can be reduced. In other words, if there is a one-to-two (or more) correspondence between the toggle signals and the address signals, less toggle signals are used to generate the same number of address signals.

In an embodiment where two address signals are generated from using one toggle signal, the number of toggle signals are reduced by one half over the embodiment where one address signal is generated from using one toggle signal, if the number of address signals generated by both embodiments are identical. Further, the number of toggle logic cells are reduced by one half as well since one toggle logic cell generates one toggle signal. Since logic gates of the toggle logic cells are in the delay path of the address signals, the amount of gate delays in the sequential gate delays associated with generation of the address signals is generally reduced by half when the number of toggle logic cells is reduced by half.

Figure 16A:
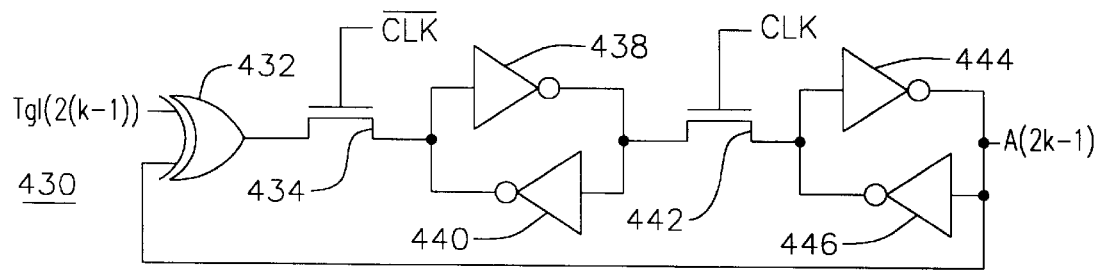
FIG. 16(a) is one embodiment of address signal generators of the present invention for odd address signals.
Figure 16B:
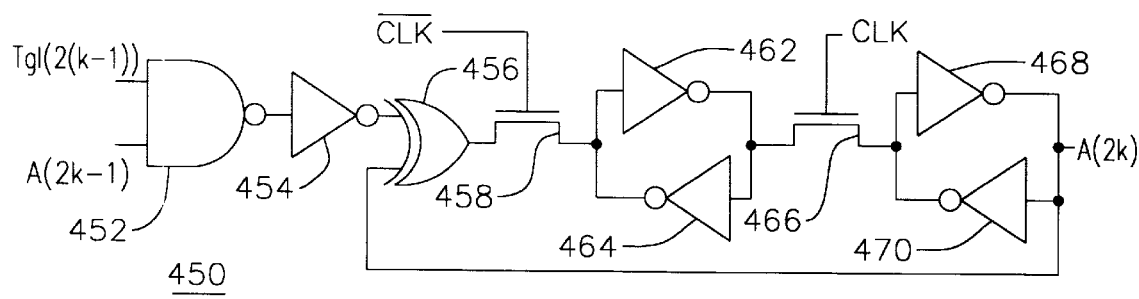
FIG. 16(b) is one embodiment of address signal generators of the present invention for even address signals.

FIGS. 16(a) and 16(b) show, respectively, odd and even address signal generators of the embodiment where each toggle signal is used during generation of two address signals. FIG. 16(a) shows an odd address signal generator 431 coupled to an output toggle address signal of an XOR gate 432, a clock signal clk and an inverse clock signal $\overline{clk}$. A structure of the odd address signal generator 431 is similar to a structure of the odd address signal generator 391 in FIG. 15(b). Inputs of the XOR gate 432 are coupled to a toggle signal $Tgl_{(2(m-1))}$ and an address signal $A_{(2m-1)}$ generated by the odd address signal generator 431.

FIG. 16(b) shows an even address signal generator 451 coupled to an output toggle address signal of XOR gate 456, a clock signal clk and an inverse clock signal $\overline{clk}$. The even address signal generator 451 is similar to a the even address signal generator 371 in FIG. 15(a). A first input of the XOR gate 456 is coupled to an address signal $A_{(2m)}$ generated by the even address signal generator 451. A second input of the XOR gate 456 is coupled to an output of an inverter 454. An input of the inverter 454 is coupled to an output of a NAND gate 452. Inputs of the NAND gate 452 are coupled with the toggle signal $Tgl_{(2(m-1))}$ and the address signal $A_{(2m-1)}$. Thus, one toggle signal $Tgl_{(2(m-1))}$ is used during generation of two address signals $A_{(2m-1)}$ and $A_{(2m)}$.

Figure 16C:
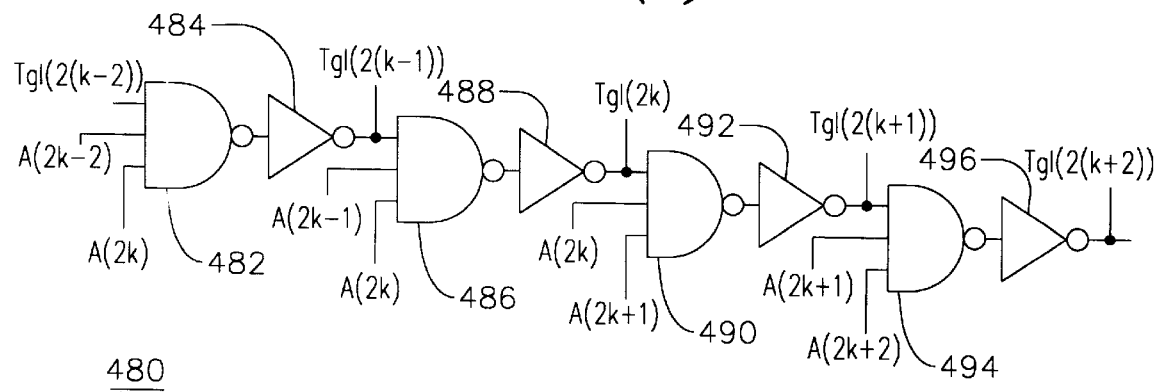
FIG. 16(c) is a signal delay path for generation of address signals using an address signal generator of the present invention.

Likewise, each of other toggle signals in this embodiment is used during generation of two address signals. For example, a toggle signal $T_{(2m)}$ is used to generate address signals $A_{(2m+1)}$ and $A_{(2m+2)}$, a toggle signal $T_{(2(m+1)}$ is used to generate address signals $A_{(2m+3)}$ and $A_{(2m+4)}$, and so on. Therefore, a number of toggle signals to be generated is reduced by a factor of two. FIG. 16(c) shows gates logic linked in series which form a delay path and cause sequential gate delays. Inputs of a three-input NAND gate 482 are coupled to a toggle signal $Tgl_{(2(m-2))}$, an address signal $A_{(2m-2)}$ and an address signal $A_{(2m-1)}$, respectively. An output of the NAND gate 482 is coupled to an input of an inverter 484. An output of the inverter 484 is the toggle signal $Tgl_{(2(m-1))}$ which is used during generation of two address signals $A_{(2m-1)}$ and $A_{(2m)}$.

The toggle signal $Tgl_{(2(m-1))}$ is coupled to an input of a three-input NAND gate 486 whose two other inputs are coupled to address signals $A_{(2m-1)}$ and $A_{(2m)}$, respectively. An output of the NAND gate 486 is coupled to an input of an inverter 488 whose output, a toggle signal $Tgl_{(2m)}$, is coupled to a next three-input NAND gate 490 in series. Thus, each of the three-input NAND gates are provided with a toggle signal and two address signals.

In the embodiment described in reference to FIG. 16, the number of NAND gates and inverters used is $$\frac{n-1}{2}.$$

This is because the first address signal generation is not associated with any sequential gate delay and each toggle logic cell is used to generate two address signals. Thus, for generation of the $21^{st}$ address signal in a 21-bit address system, the sequential gate delay due to a series of toggle logic cells is $10 \times (T_{an}+T_{ai})$, or 20 ns where $T_{an}=T_{ai}=1$ ns.

The logic gates illustrated in FIGS. 16(a)–(c) are represented by the Boolean equations (3), (4) and (5).

$$A_{(2m)}(T)=Tgl_{(2(m-1))}(T-1)\cdot A_{(2m-1)}(T-1)\oplus A_{(2m)}(T-1). \quad (3)$$

$$A_{(2m-1)}(T)=Tgl_{(2(m-1))}(T-1)\oplus A_{(2m-1)}(T-1) \quad (4)$$

$$Tgl_{(2m)}(T-1)=Tgl_{(2m-1)}(T-1)\cdot A_{(2m)}(T-1)=Tgl_{(2(m-1))}(T-1)\cdot A_{(2m-1)}(T-1)\cdot A_{(2m)}(T-1). \quad (5)$$

Equation (3) represents the even address signal generator 451 of FIG. 16(*b*). The signals $Tgl_{(2(m-1))}(T-1)$ and $A_{(2m-1)}(T-1)$ are, respectively, the toggle signal $Tgl_{(2(m-1))}$ and an address signal representing (2m−1)th address bit, both taken at time T−1 which is just before time T. In other words, the time difference between time T−1 and time T generally is a clock period of the clock signal clk. The signals $Tgl_{(2(m-1))}(T-1)$ and $A_{(2m-1)}(T-1)$ are AND'd together by the NAND gate 452 and the inverter 454.

The output of the inverter 454 is XOR'd together in the XOR gate 456 with $A_{(2m)}(T-1)$, which is an address signal representing (2m)th address bit at time T−1. The output of the XOR gate 456 is clocked into the first latch comprised of inverters 462 and 464 upon falling edge of the clock signal clk of the next clock cycle. The output of the first latch is clocked into the second latch comprised of inverters 468, 470 upon rising edge of the clock signal clk. Therefore, after falling and rising of the clock signal (one clock cycle or one clock period), a combination of signals $Tgl_{(2(m-1))}(T-1)$ and $A_{(2m-1)}(T-1)$ at time T−1 is output as an address signal $A_{(2m)}(T)$ representing $A_{(2m)}$th address bit at time T.

Equation (4) represents the odd address signal generator 431 of FIG. 16(*a*). The signals $Tgl_{(2(m-1))}(T-1)$ and $A_{(2m-1)}(T-1)$ are identical to the corresponding signals that appear in Equation (3). In equation (3), these signals are used to generate the address signal $A_{(2m)}(T)$ representing $A_{(2m)}$th address bit at time T. In equation (4), the signal $Tgl_{(2(m-1))}(T-1)$ and $A_{(2m-1)}(T-1)$ are used to generate an address signal $A_{(2m-1)}(T)$ representing $A_{(2m-1)}$th address bit at time T. Thus, the toggle signal $Tgl_{(2(m-1))}(T-1)$, which is generated at time T−1, is used to generate both address signals $A_{(2m)}(T)$ and $A_{(2m-1)}(T)$ at time T.

Equation (5) represents generation of an even toggle signal $Tgl_{(2m)}(T-1)$ from another even toggle signal $Tgl_{(2(m-1))}(T-1)$ rather than from an odd toggle signal $Tgl_{(2m-1)}(T-1)$ through Boolean manipulation. By recognizing that $Tgl_{(2m-1)}(T-1)$ is equivalent to $Tgl_{(2m-1)}(T-1)$ AND'd with $A_{(2m-1)}(T-1)$, Equation (5) provides a way to bypass generation of $Tgl_{(2m-1)}(T-1)$ where m is a positive integer: 1, 2, 3, etc. Thus, generation of all odd toggle signals, i.e., $Tgl_{(1)}$, $Tgl_{(3)}$, $Tgl_{(5)}$, etc. are avoided. As a result, the number of gate delays encountered during generation of the toggle signals, and thus the duration of sequential gate delays encountered during generation of the address signals, is reduced to one half.

In the embodiments described above, the total amount of delay was upper bounded by one clock period in order to complete generation of all address signals before the rising edge of the clock signal clocks out the address signals as outputs of the address signal generators. If a signal with a period that is longer than the clock period is used to clock out some of the address signals, additional time is available to generate those address signals. In other words, if address signals are generated with the address signal generators that use the signal with a period that is longer than the clock period, additional time can be allotted to generate them without increasing the clock period. The address signals have cycle times (periods) that are longer than a clock period. Thus, an address signal can be used instead of the clock signal for some of the address signal generators in order to allow more time for those address signal generators to generate respective address signals.

The cycle time of an address signal is a period of time between two consecutive rising edges of the address signal. The cycle times of address signals representing more significant bits are longer than the cycle times of address signals representing less significant bits. For example, a cycle time for the address signal $A_1$ is longer than a cycle time for the address signal $A_0$. In fact, the $A_1$ cycle time is about twice as long as the $A_0$ cycle time. In other words, the address signal $A_0$ transitions twice for every transition of the address signal $A_1$. Further, a cycle time of any address signal generated by the address sequencer is longer than the clock period of the internal clock signal.

For example, starting at a high-to-low transition, it takes one clock period for a low-to-high transition of the address signal $A_0$ which represents the least significant address bit. It also takes one clock period for another high-to-low transition from the low-to-high transition. Thus, the cycle time of the address signal $A_0$ is about twice as long as the clock period of the internal clock signal. As previously mentioned, the cycle time of an address signal representing a more significant address bit is longer than the cycle time of an address signal representing a lesser significant address bit. Since the address signal $A_0$ represents the least significant address bit and the cycle time of the address signal $A_0$ is longer than the clock period, all other address signals have cycle times longer than the clock period of the internal clock signal.

Therefore, the cycle time of an address signal $A_{(m-1)}$ is greater than the clock period of the internal clock signal. Since the address sequencer increments an address by one at a time, lesser significant address bits are updated more frequently than more significant address bits. For example, the address bit represented by the address signal $A_0$ is updated upon every address increment. The address bit represented by the address signal $A_1$ is updated at every other increment of the address. Generally, an address bit represented by an address signal $A_m$ is updated at every $2^m$ increments of the address.

Thus, time for generation of any address signal except for $A_0$ which represents the least significant address bit is not bounded by a clock period. In other words, all address signals except for $A_0$ may take a period longer than one clock period for generation. Therefore, by providing the address signal $A_{m-1}$ instead of the internal clock as a clock signal to generate address signals $A_m$ through $A_{n-1}$, clocks with faster frequency can be used. In other words, a longer period is available to complete address transitions, if an address signal is used instead of the clock signal to generate the address signals that represent address bits that are more significant than the address bit represented by the address signal.

Figure 17:
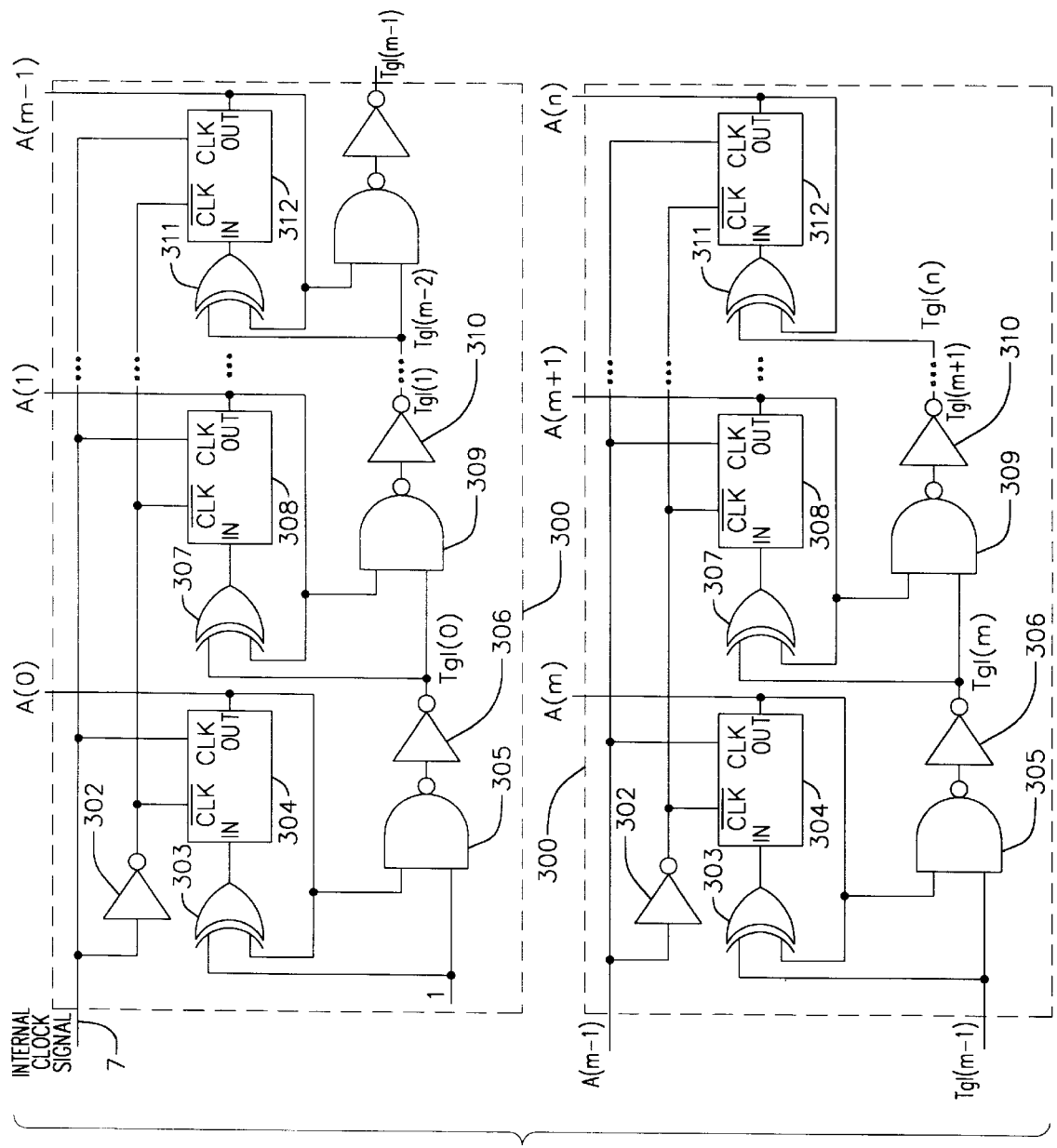
FIG. 17 is a block diagram of one embodiment of an address sequencer of the present invention.

In the address sequencer of FIG. 17, the clock provided to some of the address signal generators is an address signal instead of the clock signal. FIG. 17 shows a first address sequencer portion 300(*b*) and a second address sequencer portion 300(*c*). In the first address sequencer portion 300(*b*), an internal clock signal 7 is provided to the address signal generators 304*b*, 308*b* and 312*b* as a clock signal. The internal clock signal is inverted by an inverter 302*b* and provided as an inverse clock signal to the address signal generators.

A first input of the XOR gate 303*b* is coupled to logic "1". A second input of the XOR gate 303*b* is coupled to an output of the address signal generator 304*b*, i.e., the address signal $A_0$. The first input of the XOR gate 303*b* is also coupled to a first input of a NAND gate 305*b*. The second input of the XOR gate 303*b* is also coupled to a second input of the NAND gate 305b. An output of the NAND gate 305b is coupled to an input of an inverter 306b.

The XOR gate 303b, the NAND gate 305b and the inverter 306b represents a toggle logic cell associated with the address signal generator 304b. The toggle logic cell associated with the address signal generator 304b generates a first toggle signal $Tgl_{(0)}$. Similarly, a toggle logic cell associated with the address signal generator 308b generates a second toggle signal $Tgl_{(1)}$. This toggle logic cell associated with the address signal generator 308b is represented by an XOR gate 307b, a NAND gate 309b and an inverter 310b.

The first toggle signal $Tgl_{(0)}$, which is an output of the inverter 306b, is coupled to a first input of the XOR gate 307b and a first input of the NAND gate 309b. An address signal $A_1$ generated by the address signal generator 308b is coupled to a second input of the XOR gate 309b. An output of the NAND gate 309b is coupled to an input of the inverter 310b. An output of the inverter 310b is the second toggle signal $Tgl_{(1)}$. A first input of an XOR gate 311b is coupled to a $(n-1)_{th}$ toggle signal $Tgl_{(n-2)}$. A second input of the XOR gate 311b is coupled to an address signal $A_{(n-1)}$ generated by the address signal generator 312b.

In FIG. 17, address signals $A_0$ to $A_{(m-1)}$ are generated by a first address sequencer portion 300(b). Address signals $A_m$ to $A_{(n-1)}$ are generated by a second address sequencer portion 300(c). Address signal generators 304c, 308c and 312c are similar to the address sequencers 304b, 308b and 312b of the first address sequencer portion. Similarly, toggle logic cells comprising respectively of an XOR gate 303c, a NAND gate 305c, an inverter 306c and an XOR gate 307c, a NAND gate 309c and an inverter 310c are similar to the toggle logic cells of the first address sequencer portion.

The address signal generators 304c, 308c and 312c of the second address sequencer portion 300(c) are provided with the address signal $A_{(m-1)}$ of the first address sequencer portion as a clock signal instead of the internal clock signal 7. The address signal $A_{(m-1)}$ is inverted by an inverter 302c of the second address sequencer portion and provided as an inverse clock signal to the address signal generators 304c, 308c and 312c. As an example, for an address sequencer generating a 21-bit address and m equals 6, the first six addresses signal generators, used to generate $A_0$ to $A_5$, are provided with the internal clock signal as the clock signal. The remaining fifteen address signal generators, used to generate address signals $A_6$ to $A_{20}$, are provided with the address signal $A_5$ as the clock signal. Any address signal representing an address bit can be provided as a clock signal to address signal generators that generate address signals representing more significant address bits than the address bit represented by the address signal.

In one embodiment, a word line switch address signal is used as the clock signal to the second address sequencer portion 300(c). As previously mentioned in reference to the clock control circuit of FIG. 2, a transition from an end of one word line to a beginning of the next word line is called a boundary crossing or a word line switch. During a read operation, delays due to capacitance and resistance on a word line is increased at the word line switch. A transition of the word line switch address signal takes place at the word line switch. Thus, when the word line switch address signal is used as the clock signal $A_{(m-1)}$, the largest delay time available to the address sequencer is used. However, other address signals may be used as a clock signal for the second address sequencer portion 300(c).

By combining the embodiment of the address sequencer in FIG. 17 with the embodiment in FIG. 14 and FIGS. 15(a)–(c) or the embodiment in FIGS. 16(a)–(c), an embodiment of the address sequencer that is able to operate with high clock frequency is created. This embodiment of the address sequencer uses different toggle logic cells for even and odd address signal generators in addition to using an address signal as a clock signal for some of the address signal generators.

V. Data Sensing

Referring back to FIG. 1, the sense amplifiers 18 and 22 are coupled to individual data lines. These data lines are coupled to the bit lines of the individual memory blocks. The initial voltage level of these data lines are usually zero. However, often a data line has a higher voltage level than ground level due to capacitance developed between adjacent data lines. Therefore, as the predetermined read voltages are applied to the data lines and S/A 18 and 22 attempt to sense the data from the memory cells, a delay is experienced. Traditionally, the data lines are separated, i.e. providing a large space between the data lines to remove the delay. However, by adding a large spacing between data line, the memory die size, the physical space occupied by the flash memory device is also increased.

To remove the delay without increasing the memory die size, a pull down transistor is introduced to the data line. In FIG. 18, the pull down transistor 801 is coupled to the data line 803. The gate of the pull down transistor 801 is coupled to a reset signal line 805. Prior to the reading of a memory cell, the reset signal line 805 goes high for a short period of time. Therefore, the pull down transistor turns on and grounds the data line. With all the data lines initially starting at a ground voltage level, the capacitance coupling between data lines are reduced as well as the capacitance on the individual data lines. Therefore, the delays experienced by the data lines are reduced without increasing the memory die size.

VI. High Voltage Comparator

As illustrated in reference to FIG. 1, a program operation requires a set of predetermined voltages to be applied to the memory cells. The high voltage comparator circuit 54 of FIG. 1 comprises a set of transistors to determine the precise timing when the predetermined voltages are sufficiently high enough to start programming the memory cell. FIG. 19 illustrates one embodiment of the high voltage comparator circuit 54 of FIG. 1. The high voltage comparator circuit, in FIG. 19, detects the moment when the voltage levels, predetermined program voltages, at line AA corresponds to the voltage level at line BB. Voltage level at line $V_{ref}$ is assumed to be constantly high and the voltage level at line $V_{pp}$ is assumed to be increasing. The line $V_{pp}$ is coupled to a gate of a $V_{pp}$ transistor 181. As the voltage level at line $V_{pp}$ increases, the $V_{pp}$ transistor 181 turns on and causes the line BB, coupled to a drain of the $V_{pp}$ transistor 181, to be slowly pulled to $V_{cc}$. Therefore, as the voltage level at line $V_{pp}$ is increasing, the voltage level at line BB also gradually increases.

The line BB is also coupled to gates of a BB transistor 183 and a AA transistor 185. Hence, as the voltage level at line BB gradually increases, the BB and AA transistors gradually turn on. Coupled to a source of the AA transistor 185 is a line AA which is also coupled to a drain of a reference transistor 187. The line $V_{ref}$ is coupled to a gate of the reference transistor 187. Since the reference transistor 187 is on, due to the constant voltage level being applied at line $V_{ref}$, the voltage level at line AA is close to the voltage $V_{cc}$. As the AA transistor gradually turns on, a path to ground is developed from voltage $V_{cc}$ and thus the voltage level at line AA is gradually pulled down. Therefore, the voltage level at line AA gradually decreases as the voltage level at line BB gradually increases.

Line AA is also coupled to a gate of a AA depletion mode transistor 167 and line BB is coupled to a gate of a BB depletion mode transistor 169. As the voltage level at line BB is gradually increasing, the BB depletion mode transistor 167 is gradually turning on. Similarly, as the voltage level at line AA is gradually decreasing, the AA depletion mode transistor transistor 167 is gradually turning off. A source of the BB depletion mode transistor 169 is coupled to commonly coupled gates of a first p-channel transistor 163 and a second p-channel transistor 165. Once the BB depletion mode transistor 169 turns on, a path to ground is formed causing the first p-channel transistor 163 and the second p-channel transistor 165 to turn on.

A line $V_{PPOK}$ is coupled to a source of the AA depletion mode transistor 167 and a drain of the second p-channel transistor 165. As the second p-channel transistor turns on and the AA depletion mode transistor 167 is slowly turning off, the line $V_{PPOK}$ is provided a path to the voltage $V_{cc}$. Therefore, the line $V_{PPOK}$ sharply increases. In other words, as voltage level at line BB increases and corresponds to the voltage level at line AA in which the voltage level at line AA is decreasing, the voltage level at line $V_{PPOK}$ increases. Therefore, as soon as the voltage level at line BB is larger than the voltage level at line AA, the voltage level at line $V_{PPOK}$ sharply increases as the line $V_{PPOK}$ is pulled to voltage $V_{cc}$. The line $V_{PPOK}$ signifies that the voltage level at line BB is sufficiently high enough, i.e. the voltage level at line BB is larger than the voltage level at line AA, to start programming the memory cell. Therefore, the programming of the memory cells is started immediately when the predetermined program voltages, voltage level at line BB and at line AA, has achieved its specific operating voltage level.

VII. Conclusion

Accordingly, the present invention provides a high voltage comparator circuit with the capability to quickly determine the voltage level of the predetermined voltages for program operations. Although an application in a NOR-architecture based flash memory device is described, the high voltage comparator has a broad application in any semiconductor device requiring a similar precise determination of high voltage levels for specific types of operations. In particular, the decoder control circuit will be equally as useful in a NAND-architecture based synchronous flash memory devices as well.

In addition, although this invention has been described in certain specific embodiments, many additional modifications and variations would be apparent to those skilled in the art. It is therefore to be understood that this invention may be practiced otherwise than as specifically described. Thus, the present embodiments of the invention should be considered in all respects as illustrative and not restrictive, the scope of the invention to be determined by the appended claims and their equivalents rather than the foregoing description.

What is claimed is:

1. A high voltage comparator for use with a plurality of memory cells, the comparator comprising:
   a first input line receiving a first high voltage;
   a second input line receiving a second high voltage;
   a detector circuit is coupled to the first and second input lines and determines when the first and second high voltages are a predetermined voltage level such that a plurality of memory cells are able to be programmed; and
   a power supply coupled to the detector circuit and supplying a reference voltage to the detector circuit, the reference voltage being a predetermined voltage level lower than the first and second high voltages.

2. The high voltage comparator of claim 1 wherein the detector circuit comprises:
   a plurality of transistors coupled to the first and second input lines and the power supply and the plurality of transistors detecting when the first high voltage from the first input line corresponds to the second high voltage from the second input line.

3. The high voltage comparator of claim 2, further comprising an output line coupled to one of the plurality of transistors and the output line provides an output signal when the first high voltage correspond to the second high voltage.

4. The high voltage comparator of claim 3, wherein the plurality of transistors comprises:
   a first input transistor coupled to the first input line; and
   a second input transistor coupled the second input line.

5. The high voltage comparator of claim 4, wherein the plurality of transistors further comprises:
   a power transistor coupled to the first input transistor, a common voltage and ground;
   a reference transistor coupled to the second input transistor, a reference voltage, the common voltage;
   a first source transistor coupled to the first and second input transistors;
   a first common transistor coupled to the first input line; and
   a second common transistor coupled to the second input lines and the output line providing an output signal.

6. The high voltage comparator of claim 5, wherein the plurality of transistors further comprises:
   a second source transistor coupled to the first and second common transistors;
   a pair of cross coupled p-channel transistors coupled to the first and second common transistors; and
   a third source transistor coupled to the pair of cross coupled p-channel transistors.

7. The high voltage comparator of claim 6 wherein the first and second high voltages are higher than voltage supplied to a flash memory device, the flash memory device including the plurality of memory cells.

8. A flash memory comprising:
   a plurality of memory cells; and
   a high voltage comparator receiving a plurality of high program voltages and generating an output signal when the plurality of high program voltages correspond to each other, the plurality of high program voltages being predetermined voltages for programing the plurality of memory cells, and
   wherein the plurality of high program voltages have voltage levels higher than voltage level supplied to the flash memory.

9. The flash memory of claim 8 wherein the high voltage comparator comprises:
   a first input line receiving a high program voltage;
   a second input line receiving a different high program voltage; and
   a plurality of transistors detecting when the high program voltage correspond to the different high program voltage.

10. The flash memory of claim 9, wherein the plurality of transistors comprises:
    a first input transistor coupled to the first input line receiving the high program voltage; and
    a second input transistor coupled to the second input line receiving the different high program voltage.

11. The flash memory of claim 10, wherein the plurality of transistors further comprises:

a power transistor coupled to the first input transistor;

a reference transistor coupled to the second input transistor;

a first source transistor coupled to the first and second input transistors;

a first common transistor coupled to the first input line receiving the high program voltage; and a second common transistor coupled to the second input line receiving the different high program voltage.

12. The flash memory of claim 11, wherein the plurality of transistors further comprises:

a second source transistor coupled to the first and second common transistors;

a pair of cross coupled p-channel transistors coupled to the first and second common transistors; and a third source transistor coupled to the pair of cross coupled p-channel transistors.

13. The flash memory of claim 9, wherein the high voltage comparator further comprises an output line providing an output signal when the high program voltage corresponds to the different high program voltage.

14. The flash memory of claim 13, further comprising a plurality of decoder circuits receiving address signals and generating decoded signals.

15. The flash memory of claim 14, further comprising a plurality of write amplifiers coupled to each of the plurality of memory cell blocks.

16. The flash memory of claim 15, further comprising a plurality of sense amplifiers coupled to each of the plurality of memory cell blocks.

* * * * *